(12) United States Patent
Nishi et al.

(10) Patent No.: US 6,946,233 B2
(45) Date of Patent: Sep. 20, 2005

(54) POLYMER, RESIST MATERIAL AND PATTERNING METHOD

(75) Inventors: Tsunehiro Nishi, Niigata-ken (JP); Takeshi Kinsho, Niigata-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 4 days.

(21) Appl. No.: 10/200,647

(22) Filed: Jul. 22, 2002

(65) Prior Publication Data

US 2003/0054290 A1 Mar. 20, 2003

(30) Foreign Application Priority Data

Jul. 24, 2001 (JP) .................................. 2001-222455

(51) Int. Cl.$^7$ .......................... G03F 7/004; G03C 5/00; C08F 36/00; C08F 118/02
(52) U.S. Cl. .................... 430/270.1; 430/326; 430/905; 430/910; 526/264; 526/268; 526/271; 526/281; 526/319; 526/320
(58) Field of Search ............................. 430/270.1, 326; 526/264, 268, 271, 281, 319, 320

(56) References Cited

U.S. PATENT DOCUMENTS

| | | | | |
|---|---|---|---|---|
| 5,968,713 | A | 10/1999 | Nozaki et al. | 430/326 |
| 6,013,416 | A | 1/2000 | Nozaki et al. | 430/283.1 |
| 6,200,725 | B1 | 3/2001 | Takechi et al. | 430/270.1 |
| 6,312,867 | B1 | 11/2001 | Kinsho et al. | 430/270.1 |
| 6,329,125 | B2 | 12/2001 | Takechi et al. | 430/326 |
| 6,391,520 | B1 | 5/2002 | Nakano et al. | 430/270.1 |
| 2003/0054286 | A1 * | 3/2003 | Sato et al. | |

* cited by examiner

Primary Examiner—Rosemary Ashton
(74) Attorney, Agent, or Firm—Myers Bigel Sibley & Sajovec, P.A.

(57) ABSTRACT

Provided are a resist material having markedly high resolution and etching resistance of a practically usable level, and being useful for fine microfabrication; a patterning method using the resist material; and a polymer useful as a base resin for the resist material. More specifically, provided are a polymer having a weight-average molecular weight of 1,000 to 500,000, which comprises one or more repeating units selected from the group consisting of repeating units represented by formulae (1) to (3) below; and one or more repeating units of the formula (4) below; and a resist material containing the polymer.

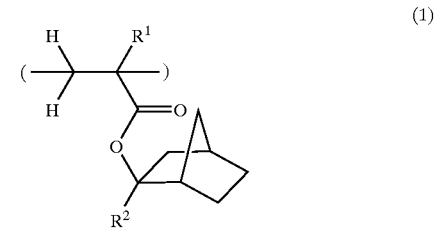

(1)

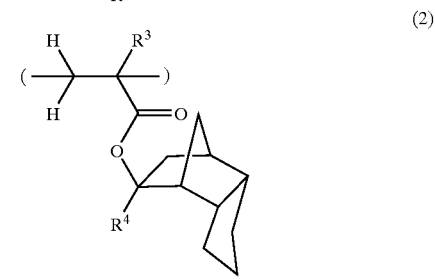

(2)

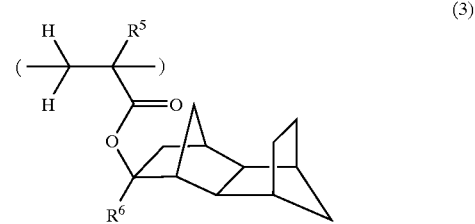

(3)

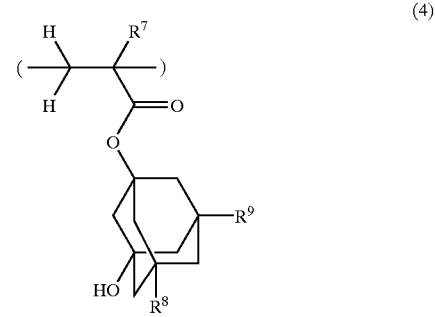

(4)

14 Claims, No Drawings

POLYMER, RESIST MATERIAL AND PATTERNING METHOD

RELATED APPLICATION

This application claims priority from Japanese Patent Application No. 2001-222455 filed Jul. 24, 2001, the disclosure of which is incorporated by reference herein in its entirety.

BACKGROUND OF THE INVENTION

1. Field of the Invention

The present invention relates to polymers useful as a base resin for a resist material useful for microfabrication for ultra LSI, resist materials containing the polymers and patterning method using the resist materials.

2. Description of the Related Art

With a recent thrust towards high integration and high operation speed in LSI devices, there has recently been a demand for miniaturization of a pattern rule. Under such a situation, far UV lithography is regarded as promising next-generation microfabrication technology. In particular, photolithography using a KrF or ArF excimer laser light as a light source is eagerly desired to reach the practical level as a technique indispensable for nano-microfabrication capable of achieving a feature size of 0.3 μm or less.

As a resist material for KrF excimer laser, polyhydroxystyrene having both transparency and etching resistance, each on a practical level, has become a standard base resin. As a resist material for ArF excimer laser, on the other hand, polyacrylic or polymethacrylic acid derivatives having an adamantyl structure on the side chain thereof have been used relatively frequently as described, for example, in Japanese Patent Provisional Publication No. 9-73173/1997 or 9-90637/1997, but they do not always exhibit their performances fully.

Resist materials containing a polyacrylic or polymethacrylic acid derivative as a base resin show good sensitivity and resolution on pattering by exposure to light and development, but their dry etching resistance is markedly low. Introduction of many polycyclic structures typified by an adamantane structure is effective for heightening a carbon density, thereby improving dry etching resistance. When a polymer having many acid decomposable units having an adamantane structure, more specifically, many (meth)acrylic acid units protected by a 2-methyl-2-adamantyl group is used as a base resin, however, its dull acid decomposition reactivity leads to insufficient resolution. Resist materials using such a polymer as a base resin involve problems such poor capacity of forming thin lines upon etching, high temperature dependence upon heat treatment for an acid decomposition reaction, and remaining of unreacted products on the substrate as a foreign matter after patterning. Incidentally, the term "(meth)acrylate" as used herein means methacrylate or acrylate.

SUMMARY OF THE INVENTION

With the foregoing in view, the present invention has been made. An object of the present invention is to provide a resist material having markedly high resolution and etching resistance of a practically usable level and useful for precise microfabrication; a patterning method using the resist material; and a polymer useful as a base resin for the resist material.

The present inventor has proceeded with an extensive investigation with a view toward attaining the above-described object. As a result, it has been found that a poly(meth)acrylic acid derivative having specific repeating units, which will be described later, has both high acid decomposition reactivity and etching resistance, and a resist material using the derivative as a base resin has markedly high resolution and etching resistance of a practically usable level, leading to the completion of the invention.

In one aspect of the present invention, there is thus provided a polymer having a weight-average molecular weight of 1,000 to 500,000, which comprises one or more repeating units selected from the group consisting of repeating units represented by formulae (1) to (3), and one or more repeating units represented by formula (4); and a resist material comprising the polymer. The weight-average molecular weight of the polymer is measured by gel permeation chromatography (GPC) based on polystyrene standard.

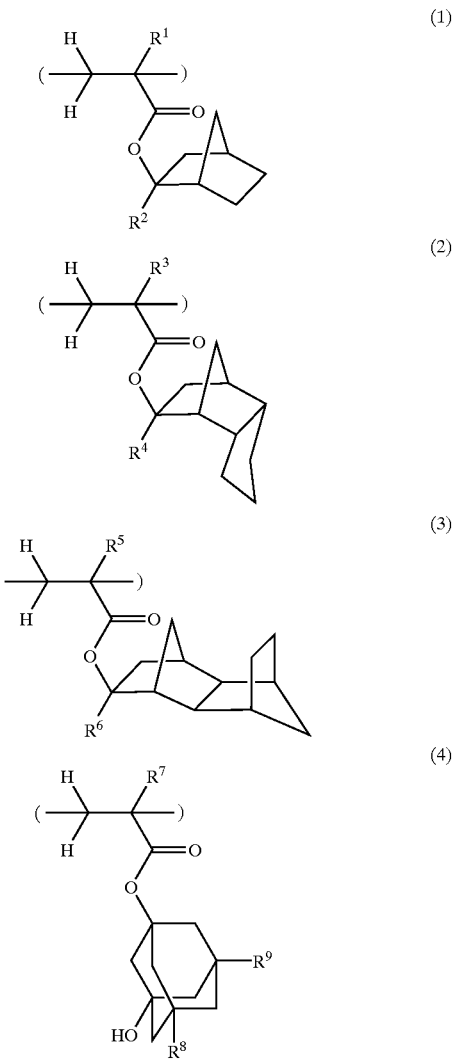

wherein $R^1$, $R^3$, $R^5$ and $R^7$ each represents a hydrogen atom or a methyl group, $R^2$, $R^4$ and $R^6$ each represents a linear, branched or cyclic $C_{1-8}$ alkyl group, and $R^8$ and $R^9$ each represents a hydrogen atom or a hydroxyl group, with a proviso that $R^2$, $R^4$ and $R^6$ are bonded in endo-sites of a bicyclo[2.2.1]heptane ring, a tricyclo[5.2.1.0$^{2,6}$]decane ring and a tetracyclo[4.4.0.1$^{2,5}$.1$^{7,10}$]dodecane ring, respectively.

In another aspect of the invention, there is also provided a patterning method comprising steps of applying the resist material to a substrate; after heat treatment, exposing the resulting substrate to a high energy beam or an electron beam through a photomask; and after heat treatment, developing with a developer.

The repeating units represented by the formulae (1) to (3) are units generating a carboxylic acid by decomposing under acidic conditions. As described in Japanese Patent Provisional Publication No. 2000-336121, the decomposition proceeds via a markedly stable intermediate owing to its peculiar steric structure so that they have extremely high acid decomposition sensitivity. A repeating unit represented by the formula (4), on the other hand, has an adamantane structure so that it has high etching resistance. The repeating units of the formulae (1) to (3) having a crosslinked ring structure have, by themselves, etching resistance of a medium level. Combination of one or more units selected from the group consisting of the units represented by formulae (1) to (3), and one or more units represented by formula (4), can impart the resulting polymer with markedly high acid decomposition sensitivity and etching resistance of a practically usable level. Resist materials having such a polymer as a base resin therefore can endure etching sufficiently while having high resolution and are very useful for the formation of ultrafine patterns.

The resist material containing the polymer of the invention as a base resin is responsive to high energy beams and has excellent sensitivity, resolution and etching resistance so that it is useful for microfabrication by electron beams or far UV rays. It exhibits a small absorption at an exposure wavelength of an ArF excimer laser or a KrF excimer laser, which facilitates formation of patterns which are minute and perpendicular to the substrate.

DETAILED DESCRIPTION OF THE PREFERRED EMBODIMENT

The present invention will hereinafter be described more specifically.

The novel polymers of the invention each has a weight-average molecular weight of 1,000 to 500,000 and each comprises (a): one or more repeating units represented by the formulae (1) to (3), and (b): one or more repeating units represented by the formula (4);

In the formulas, $R^1$, $R^3$, $R^5$ and $R^7$ each represents a hydrogen atom or a methyl group. $R^2$, $R^4$ and $R^6$ each represents a linear, branched or cyclic $C_{1-8}$ alkyl group. Specific examples of such an alkyl group include methyl, ethyl, propyl, isopropyl, n-butyl, sec-butyl, tert-butyl, tert-amyl, n-pentyl, n-hexyl, cyclopentyl and cyclohexyl groups. $R^8$ and $R^9$ each represents a hydrogen atom or a hydroxyl group. The $R^2$, $R^4$ and $R^6$ are bonded in endo-sites of a bicyclo[2.2.1]heptane ring, a tricyclo[5.2.1.0$^{2,6}$]decane ring and a tetracyclo[4.4.0.1$^{2,5}$.1$^{7,10}$]dodecane ring, respectively. Only this steric structure makes it possible to impart the resulting polymer with sensitive acid decomposition reactivity. The reason for it is as described in Japanese Patent Provisional Publication No. 2000-336121.

The followings are specific examples of the repeating units represented by the formulae (1) to (3), but the invention is not limited thereto.

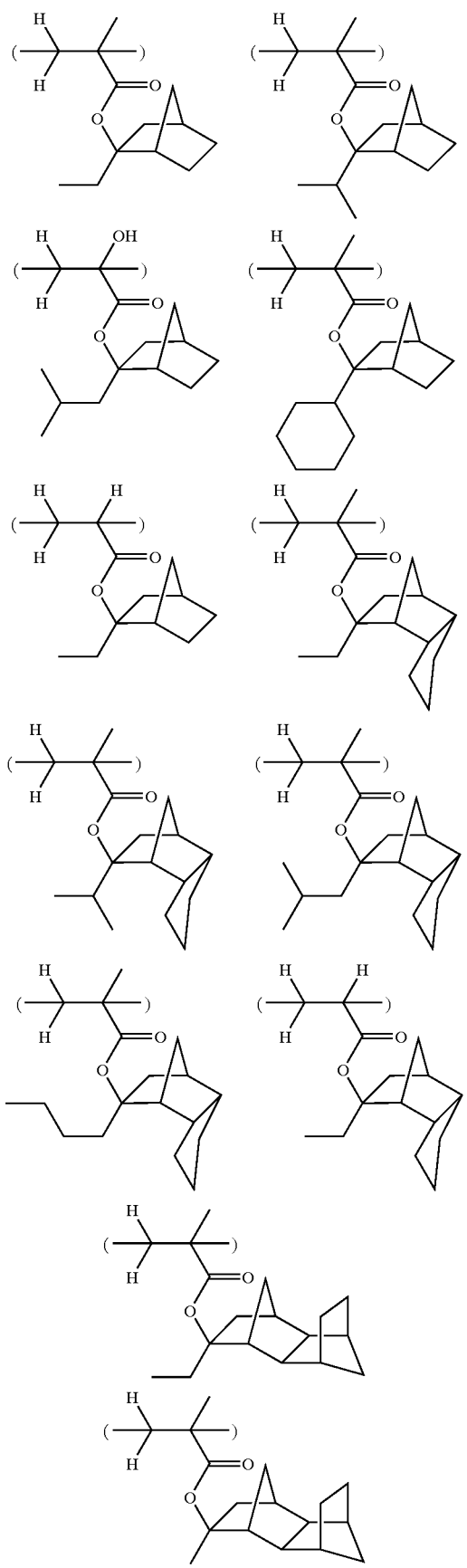

-continued
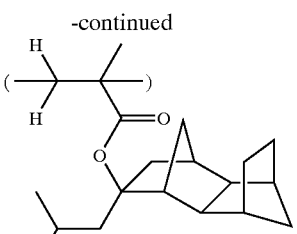
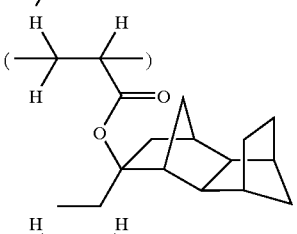
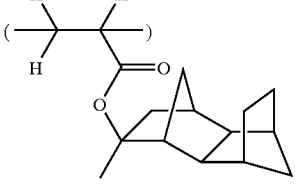
The followings are specific examples of the repeating units represented by the formula (4).
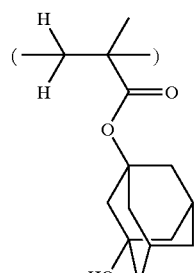 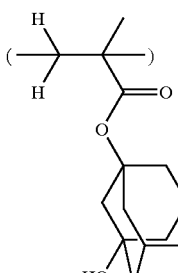
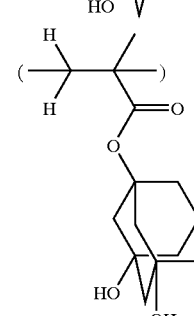 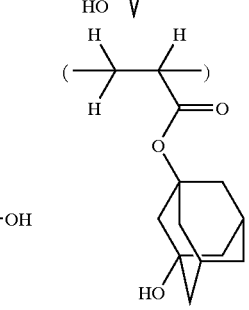
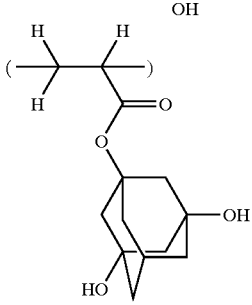 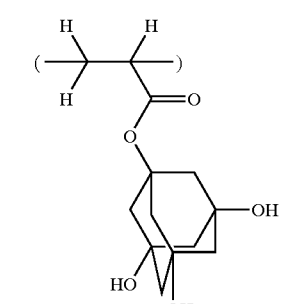
The polymers of the invention may contain one or more repeating units selected from those represented by the following formulas (M1) to (M9):
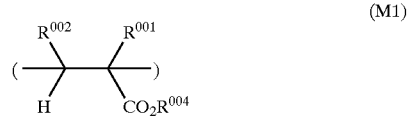 (M1)
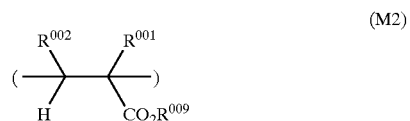 (M2)
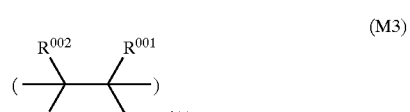 (M3)
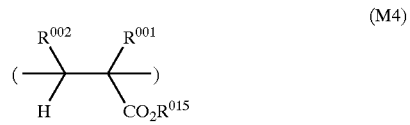 (M4)
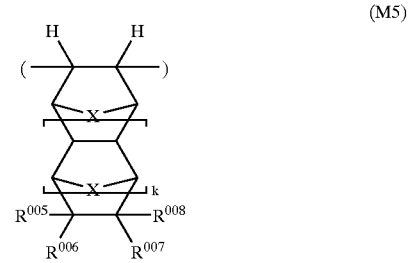 (M5)
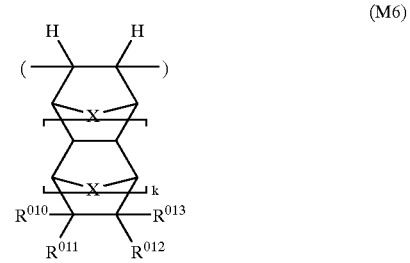 (M6)
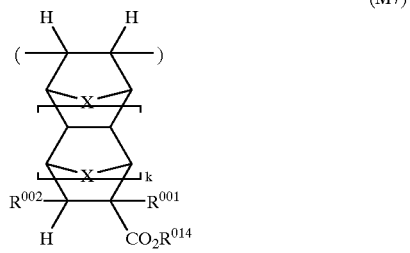 (M7)
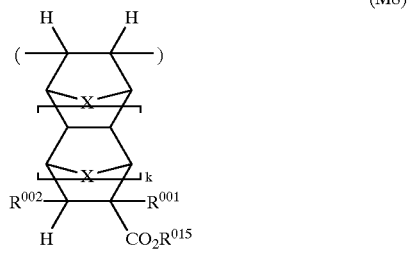 (M8)

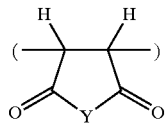

(M9)

wherein $R^{001}$ represents a hydrogen atom, a methyl group, or $CH_2CO_2R^{003}$; $R^{002}$ represents a hydrogen atom, a methyl group, or $CO_2R^{003}$; $R^{003}$ represents a linear, branched or cyclic $C_{1-15}$ alkyl group; $R^{004}$ represents a hydrogen atom or a monovalent $C_{1-15}$ hydrocarbon group having a carboxyl or hydroxyl group. At least one of $R^{005}$ to $R^{008}$ represents a monovalent $C_{1-15}$ hydrocarbon group having a carboxyl or hydroxyl group while the remaining groups thereof each independently represents a hydrogen atom or a linear, branched or cyclic $C_{1-15}$ alkyl group; $R^{005}$ to $R^{008}$ may be taken together to form a ring wherein at least one of $R^{005}$ to $R^{008}$ represents a divalent $C_{1-15}$ hydrocarbon group having a carboxyl or hydroxyl group, while the remaining groups thereof each independently represents a single bond or a linear, branched or cyclic $C_{1-15}$ alkylene group; $R^{009}$ represents a monovalent $C_{2-15}$ hydrocarbon group having at least one partial structure selected from ether, aldehyde, ketone, ester, carbonate, acid anhydride, amide and imide; At least one of $R^{010}$ to $R^{013}$ represents a monovalent $C_{2-15}$ hydrocarbon group having at least one partial structure selected from ether, aldehyde, ketone, ester, carbonate, acid anhydride, amide and imide, while the remaining groups thereof each independently represents a hydrogen atom or a linear, branched or cyclic $C_{1-15}$ alkyl group; $R^{010}$ to $R^{013}$ may be taken together to form a ring wherein at least one of $R^{010}$ to $R^{013}$ represents a divalent $C_{1-15}$ hydrocarbon group having at least one partial structure selected from ether, aldehyde, ketone, ester, carbonate, acid anhydride, amide and imide, while the remaining groups thereof each independently represents a single bond or a linear, branched or cyclic $C_{1-15}$ alkylene group; $R^{014}$ represents a polycyclic $C_{7-15}$ hydrocarbon group or an alkyl group containing a polycyclic hydrocarbon group; $R^{015}$ represents an acid labile group, X represents $CH_2$ or an oxygen atom, Y represents —O— or —($NR^{016}$)—; $R^{016}$ represents a hydrogen atom or a linear, branched or cyclic $C_{1-15}$ alkyl group, and k stands for 0 or 1.

In the above-described formulas, $R^{001}$ represents a hydrogen atom, a methyl group, or $CH_2CO_2R^{003}$. Specific examples of $R^{003}$ will be described below. $R^{002}$ represents a hydrogen atom, a methyl group, or $CO_2R^{003}$. $R^{003}$ represents a linear, branched or cyclic $C_{1-15}$ alkyl group. Examples include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, and butyladamantyl.

$R^{004}$ represents a hydrogen atom or a monovalent $C_{1-15}$ hydrocarbon group having a carboxyl or hydroxyl group. Specific examples include hydrogen atom, and carboxyethyl, carboxybutyl, carboxycyclopentyl, carboxycyclohexyl, carboxynorbornyl, carboxyadamantyl, hydroxyethyl, hydroxybutyl, hydroxycyclopentyl, hydroxycyclohexyl, hydroxynorbornyl, and hydroxyadamantyl groups.

At least one of $R^{005}$ to $R^{008}$ represents a monovalent $C_{1-15}$ hydrocarbon group having a carboxyl or hydroxyl group while the remaining groups each independently represents a hydrogen atom or a linear, branched or cyclic $C_{1-15}$ alkyl group. Examples of the monovalent $C_{1-15}$ hydrocarbon group having a carboxyl or hydroxyl group include carboxy, carboxymethyl, carboxyethyl, carboxybutyl, hydroxymethyl, hydroxyethyl, hydroxybutyl, 2-carboxyethoxycarbonyl, 4-carboxybutoxycarbonyl, 2-hydroxyethoxycarbonyl, 4-hydroxybutoxycarbonyl, carboxycyclopentyloxycarbonyl, carboxycyclohexyloxycarbonyl, carboxynorbornyloxycarbonyl, carboxyadamantyloxycarbonyl, hydroxycyclopentyloxycarbonyl, hydroxycyclohexyloxycarbonyl, hydroxynorbornyloxycarbonyl, and hydroxyadamantyloxycarbonyl. Examples of the linear, branched or cyclic $C_{1-15}$ alkyl group are similar to those exemplified as $R^3$. $R^{005}$ to $R^{008}$ may be taken together to form a ring, and in such a case, at least one of $R^{005}$ to $R^{008}$ represents a divalent $C_{1-15}$ hydrocarbon group having a carboxyl or hydroxyl group, while the remaining groups each independently represents a single bond or a linear, branched or cyclic $C_{1-15}$ alkylene group. Specific examples of the divalent $C_{1-15}$ hydrocarbon group having a carboxyl or hydroxyl group include groups obtained by removing one hydrogen atom from the above-described monovalent hydrocarbon groups having a carboxyl or hydroxyl group. Specific examples of the linear, branched or cyclic $C_{1-15}$ alkylene group include groups obtained by removing one hydrogen atom from the groups exemplified above as $R^3$.

$R^{009}$ represents a monovalent $C_{2-15}$ hydrocarbon group containing at least one partial structure selected from ether, aldehyde, ketone, ester, carbonate, acid anhydride, amide and imide. Specific examples include methoxymethyl, methoxyethoxymethyl, 2-oxooxolan-3-yl, 2-oxooxolan-4-yl, 4,4-dimethyl-2-oxooxolan-3-yl, 4-methyl-2-oxooxan-4-yl, 2-oxo-1,3-dioxolan-4-ylmethyl, and 5-methyl-2-oxooxolan-5-yl.

At least one of $R^{010}$ to $R^{013}$ represents a monovalent $C_{2-15}$ hydrocarbon group containing at least one partial structure selected from ether, aldehyde, ketone, ester, carbonate, acid anhydride, amide and imide, while the remaining groups each independently represents a hydrogen atom or a linear, branched or cyclic $C_{1-15}$ alkyl group. Examples of the monovalent $C_{2-15}$ hydrocarbon group containing at least one partial structure selected from ether, aldehyde, ketone, ester, carbonate, acid anhydride, amide and imide include methoxymethyl, methoxymethoxymethyl, formyl, methylcarbonyl, formyloxy, acetoxy, pivaloyloxy, formyloxymethyl, acetoxymethyl, pivaloyloxymethyl, methoxycarbonyl, 2-oxooxolan-3-yloxycarbonyl, 4,4-dimethyl-2-oxooxolan-3-yloxycarbonyl, 4-methyl-2-oxooxan-4-yloxycarbonyl, 2-oxo-1,3-dioxolan-4-ylmethyloxycarbonyl, and 5-methyl-2-oxooxolan-5-yloxycarbonyl. Examples of the linear, branched or cyclic $C_{1-15}$ alkyl group are similar to those exemplified above as $R^{003}$. $R^{010}$ to $R^{013}$ may be taken together to form a ring, and in such a case, at least one of $R^{010}$ to $R^{013}$ represents a divalent $C_{1-15}$ hydrocarbon group containing at least one partial structure selected from ether, aldehyde, ketone, ester, carbonate, acid anhydride, amide and imide, while the remaining groups each independently represents a single bond or a linear, branched or cyclic $C_{1-15}$ alkylene group. Examples of the divalent $C_{1-15}$ hydrocarbon group containing at least one partial structure selected from ether, aldehyde, ketone, ester, carbonate, acid anhydride, amide and imide include 2-oxapropane-1,3-diyl, 1,1-dimethyl-2-oxapropane-1,3-diyl, 1-oxo-2-oxapropane-1,3-diyl, 1,3-dioxo-2-oxapropane-1,3-diyl, 1-oxo-2-oxabutane-1,4-diyl and 1,3-dioxo-2-oxabutane-1,4-diyl, as well as groups obtained by removing one hydrogen atom from the groups exemplified as the monovalent $C_{1-15}$ hydrocarbon group containing at least one partial structure selected from ether, aldehyde, ketone, ester, carbonate, acid anhydride, amide and imide. Examples of the linear, branched or cyclic $C_{1-15}$ alkylene group include groups obtained by removing one hydrogen atom from the groups exemplified above as $R^{003}$.

$R^{014}$ represents a polycyclic $C_{7-15}$ hydrocarbon group or an alkyl group containing a polycyclic hydrocarbon group. Specific examples include norbornyl, bicyclo[3.3.1]nonyl, tricyclo[5.2.1.0$^{2,6}$]decyl, adamantyl, ethyladamantyl, butyladamantyl, norbornylmethyl, and adamantylmethyl groups. $R^{015}$ represents an acid labile group and its specific examples will be described later. X represents $CH_2$ or an oxygen atom. Y represents —O— or —(NR$^{016}$)—. $R^{016}$ represents a hydrogen atom or a linear, branched or cyclic $C_{1-15}$ alkyl group and specific examples thereof include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, and butyladamantyl. The letter k stands for 0 or 1.

As the acid liable group of $R^{015}$, various acid labile groups can be employed, but specific examples include groups represented by the following formulas (L1) to (L4), tertiary alkyl groups having 4 to 20, preferably 4 to 15 carbon atoms, trialkylsilyl groups with each alkyl thereof having 1 to 6 carbon atoms, and $C_{4-20}$ oxoalkyl groups.

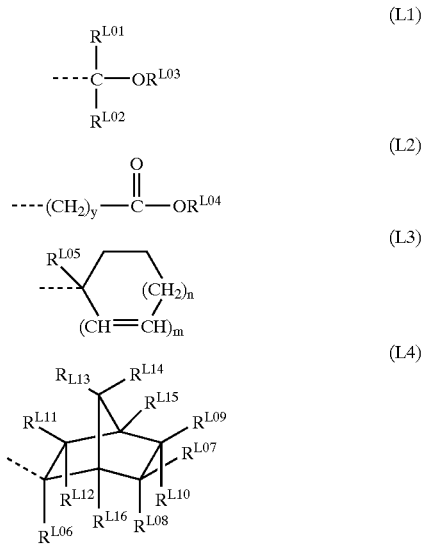

In these formulas, the broken line denotes (and will denote hereinafter) a free valence bond. $R^{L01}$ and $R^{L02}$ each represents a hydrogen atom or a linear, branched or cyclic alkyl group having 1 to 18, preferably 1 to 10 carbon atoms. Specific examples include methyl, ethyl, propyl, isopropyl, n-butyl, sec-butyl, tert-butyl, cyclopentyl, cyclohexyl, 2-ethylhexyl, and n-octyl. $R^{L03}$ represents a monovalent hydrocarbon group having 1 to 18, preferably 1 to 10 carbon atoms, which may contain a hetero atom such as oxygen. Examples include linear, branched or cyclic alkyl groups and these groups in which one or more hydrogen atoms have been substituted by hydroxyl, alkoxy, oxo, amino or alkylamino groups. Specific examples include the below-described substituted alkyl groups.

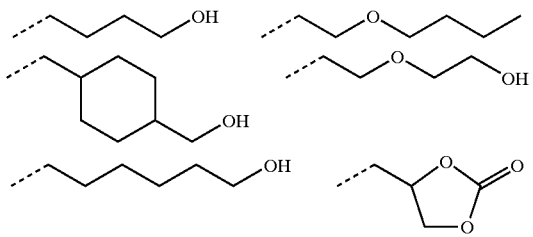

A pair of $R^{L01}$ and $R^{L02}$, $R^{L01}$ and $R^{L03}$, or $R^{L02}$ and $R^{L03}$ may be taken together to form a ring. When they form a ring, $R^{L01}$, $R^{L02}$ and $R^{L03}$ each represents a linear or branched alkylene group having 1 to 18, preferably 1 to 10 carbon atoms.

$R^{L04}$ represents a tertiary alkyl group having 4 to 20, preferably 4 to 15 carbon atoms, a trialkylsilyl group with each alkyl having 1 to 6 carbon atoms, a $C_{4-20}$ oxoalkyl group, or a group of formula (L1). Examples of the tertiary alkyl group include tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl. Examples of the trialkylsilyl group include trimethylsilyl, triethylsilyl, and dimethyl-tert-butylsilyl, while those of the oxoalkyl group include 3-oxocyclohexyl, 4-methyl-2-oxooxan-4-yl, and 5-methyl-2-oxooxolan-5-yl. Letter y stands for an integer of 0 to 6.

$R^{L05}$ represents a monovalent $C_{1-8}$ hydrocarbon group which may contain a hetero atom, or a substituted or unsubstituted $C_{6-20}$ aryl group. Examples of the monovalent hydrocarbon group which may contain a hetero atom include linear, branched or cyclic alkyl groups such as methyl, ethyl, propyl, isopropyl, n-butyl, sec-butyl, tert-butyl, tert-amyl, n-pentyl, n-hexyl, cyclopentyl, and cyclohexyl, and groups obtained by substituting one or more hydrogen atoms of the above exemplified groups with hydroxyl, alkoxy, carboxy, alkoxycarbonyl, oxo, amino, alkylamino, cyano, mercapto, alkylthio, or sulfo group. Examples of the substituted or unsubstituted aryl group include phenyl, methylphenyl, naphthyl, anthryl, phenanthryl, and pyrenyl. Letter m stands for 0 or 1, n stands for any one of 0, 1, 2 and 3, and they satisfy the equation: 2m+n=2 or 3.

$R^{L06}$ represents a monovalent $C_{1-8}$ hydrocarbon group which may have a hetero atom, or a substituted or unsubstituted $C_{6-20}$ aryl group. Examples of these groups are similar to those described above for $R^{L05}$. $R^{L07}$ to $R^{L16}$ each independently represents a hydrogen atom or a monovalent $C_{1-15}$ hydrocarbon group which may contain a hetero atom. Specific examples include linear, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and groups obtained by substituting one or more hydrogen atoms of the above-exemplified alkyl groups by hydroxyl, alkoxy, carboxy, alkoxycarbonyl, oxo, amino, alkylamino, cyano, mercapto, alkylthio, or sulfo groups. $R^{L07}$ to $R^{L16}$ (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, or $R^{L13}$ and $R^{L14}$) may be taken together to form a ring. In such a case, $R^{L07}$ to $R^{L16}$ each represents a divalent $C_{1-15}$ hydrocarbon group which may contain a hetero atom. Specific examples include groups obtained by removing a hydrogen atom from the above-described monovalent hydrocarbon groups. Two of $R^{L07}$ to $R^{L16}$ which are bonded to adjacent carbon atoms (for example, a pair of $R^{L07}$ and $R^{L09}$, $R^{L09}$ and $R^{L15}$, or $R^{L13}$ and $R^{L15}$) may be coupled directly to form a double bond.

Of the acid labile groups of the formula (L1), specific examples of the linear or branched ones are as follows:

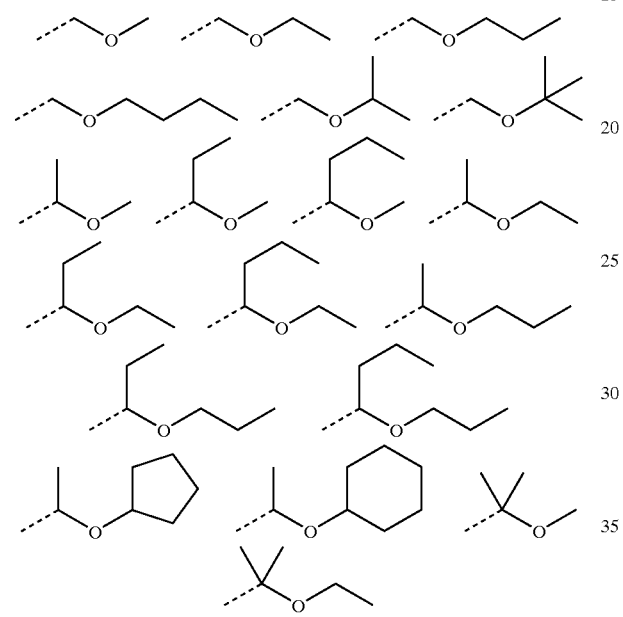

Of the above-described acid labile groups of the formula (L1), the cyclic ones include tetrahydrofuran-2-yl, 2-methyltetrahydrofuran-2-yl, tetrahydropyran-2-yl, and 2-methyltetrahydropyran-2-yl.

Specific examples of the acid labile groups of the formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Examples of the acid labile groups of the formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxy-n-butyl) cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl.

Examples of the acid labile groups of the formula (L4) include the following groups:

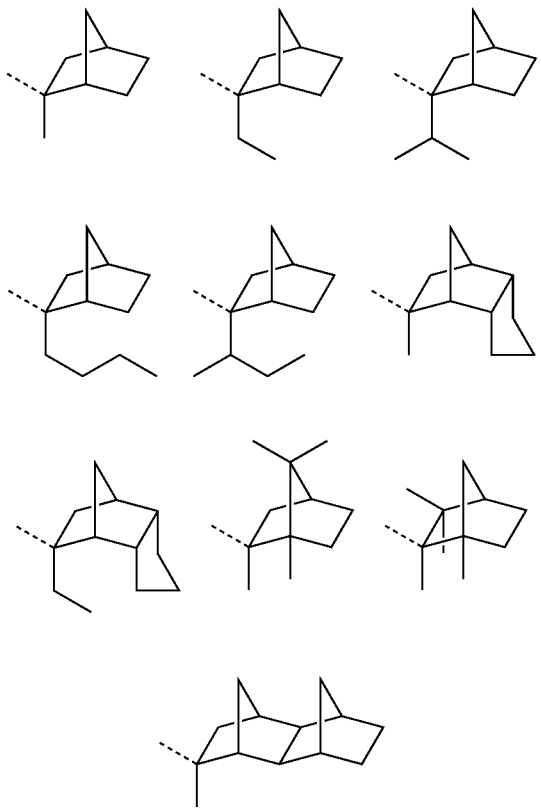

Examples of the tertiary $C_{4-20}$ alkyl groups, trialkylsilyl groups with each alkyl having 1 to 6 carbon atoms and $C_{4-20}$ oxoalkyl groups are similar to those exemplified as $R^{L04}$.

The repeating units represented by the formulas (M1) to (M9) impart the resist material with various properties such as affinity to a developer, adhesion to a substrate and etching resistance. By controlling the content of these repeating units as needed, fine adjustment of the performance of the resist material can be achieved. The units of the below-described formulas (M2-1) to (M2-4) have particularly high effects for improving its solubility in a solvent such as propylene glycol monomethyl ether acetate or its affinity to a developer so that addition of one or more units selected from the group consisting of units represented by formulae (1) to (3), in combination with one or more units represented by formula (4) is preferred.

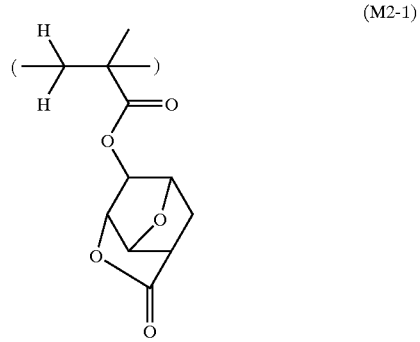

(M2-1)

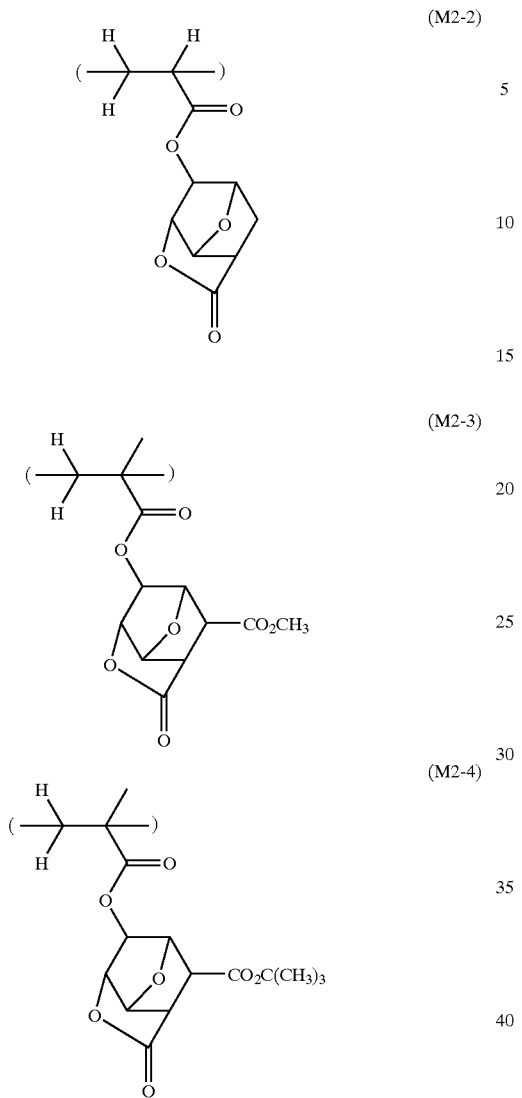

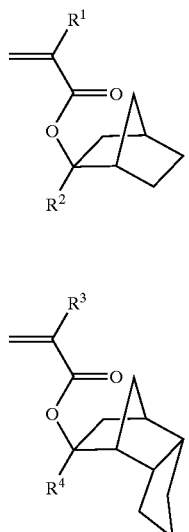

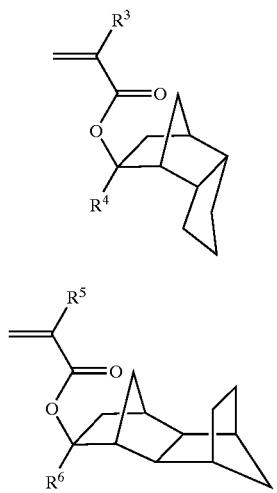

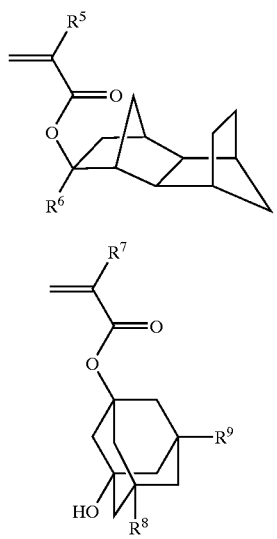

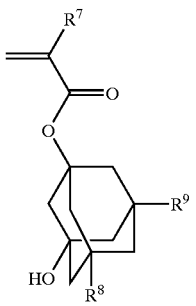

wherein $R^1$ to $R^9$ have the same meanings as described above.

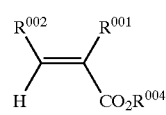

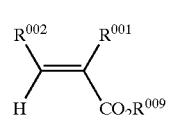

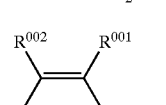

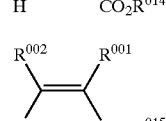

The polymer of the present invention has preferably a weight-average molecular weight, as measured by gel permeation chromatography (GPC) based on polystyrene standard, of 1,000 to 500,000, preferably 3,000 to 100,000. Outside this range, a marked deterioration in etching resistance or lowering in resolution owing to loss of a substantial difference in a dissolution rate before and after exposure may occur.

The polymers of the invention can be prepared by the copolymerization of one or more compounds represented by the formulae (1a) to (3a) below, the compounds being used as the first monomer, or the first and second monomers, or the first and second and third monomers; a compound represented by formula (4a) below being used as the second or third or fourth monomer; and optionally, one or more compounds selected from compounds represented by the formulae (M1a) to (M9a) below being used as the third or later monomer.

-continued

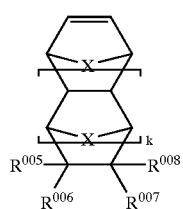
(M5a)

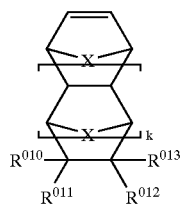
(M6a)

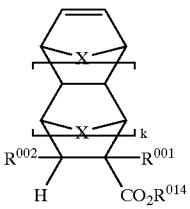
(M7a)

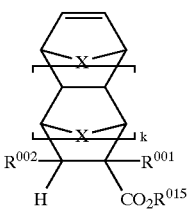
(M8a)

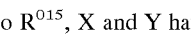
(M9a)

wherein k, $R^{001}$ to $R^{015}$, X and Y have the same meanings as described above.

Control of an existing ratio of each monomer as needed in each copolymerization reaction can produce a polymer capable of exhibiting a desired performance when contained in a resist material.

In this case, the polymers of the present invention can be produced by copolymerization of (i) one or more monomers selected from the group consisting of monomers of formulae (1a) to (3a), (ii) one or more monomers of formula (4a), and (iii) one or more monomers selected from the group consisting of monomers of formulae (M1a) to (M9a), and (iv) one or more monomers other than those described in (i) to (iii) and having a carbon-carbon double bond such as substituted acrylates such as methyl methacrylate, methyl crotonate, dimethyl maleate, and dimethyl itaconate, unsaturated carboxylic acids such as maleic acid, fumaric acid and itaconic acid, norbornene, substituted norbornenes such as methyl norbornene-5-carboxylate, and unsaturated acid anhydrides such as itaconic anhydride. Another monomer having a carbon-carbon double bond is also usable for copolymeriation.

In the polymer of the invention, the preferred proportion of repeating units available from respective monomers may fall within the following range, though not limited thereto. As for the following range, when the sum of components of (i) and (ii) is less than 100 mol %, the component for (iii) and/or (iv) may be added to fill the remainder.

(i) 1 to 99 mol %, preferably 5 to 90 mol %, more preferably 19 to 80 mol %, further more preferably 20 to 70 mol % of one or more repeating units selected from the group consisting of the units represented by the formula (1) to (3) derived from the monomers of formulae (1a) to (3a), (ii) 1 to 99 mol %, preferably 1 to 90 mol %, more preferably 5 to 80 mol %, further more preferably 10 to 70 mol % of one or more repeating units of the formula (4) derived from the monomers of formula (4a), (iii) 0 to 60 mol %, preferably 0 to 40 mol %, more preferably 0 to 30 mol % of one or more repeating units selected from the group consisting of the units represented by formulas (M1) to (M9) derived from the monomers of (M1a) to (M9a), and (iv) 0 to 60 mol %, preferably 0 to 40 mol %, more preferably 0 to 30 mol % of one or more other repeating units derived from the other monomers.

The monomers of formulae (1a) to (3a) from which the units of formulae (1) to (3) are derived can each be prepared by the process described in Japanese Patent Provisional Publication No. 2000-336121, while the monomers of formula (4a) from which the units of formula (4) are derived can be prepared by the process described in Japanese Patent Provisional Publication No. 2000-122295. These monomers are polymerized to be the polymers of the present invention.

A variety of copolymerization reactions can be used for preparing the polymer of the invention. Among them, radical polymerization is preferred.

Radical polymerization is preferably carried out (a) in a solvent of, for example, hydrocarbon such as benzene, ether such as tetrahydrofuran, alcohol such as ethanol, ketone such as methyl isobutyl ketone, propylene glycol monomethyl ether acetate or nitrile such as butylonitrile; (b) in the presence of a polymerization initiator, for example, an azo compound such as 2,2'-azobisisobutyronitrile, or a peroxide such as benzoyl peroxide or lauroyl peroxide, (c) at a reaction temperature of about 0 to 100° C., (e) in a reaction period of about 0.5 to 48 hours. However, it should not be construed that reaction conditions outside the above described range are omitted.

The polymer of the invention is effective as a base polymer for resist materials. The invention provides a resist material, particularly, a chemically amplified positive resist material containing the polymer.

The resist material of the invention may contain a compound capable of generating an acid when exposed to a high energy beam or an electron beam (which compound will hereinafter be called "acid generator") and an organic solvent, and if necessary another component.

Examples of the acid generator usable in the invention include:

(i) onium salts of formula (Pla-1), (Pla-2) or (Plb) below,
(ii) diazomethane derivatives of formula (P2) below,
(iii) glyoxime derivatives of formula (P3) below,
(iv) bissulfone derivatives of formula (P4) below,
(v) sulfonic acid esters of an N-hydroxyimide compound, said esters being represented by formula (P5) below,
(vi) β-ketosulfonic acid derivatives,
(vii) disulfone derivatives, (viii) nitrobenzyl sulfonate derivatives, and
(ix) sulfonic acid ester derivatives.

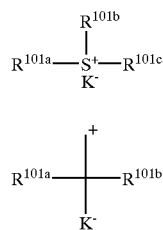

wherein $R^{101a}$, $R^{101b}$ and $R^{101c}$ each represents a linear, branched or cyclic $C_{1-12}$ alkyl, alkenyl, oxoalkyl or oxoalkenyl group, a $C_{6-20}$ aryl group, or a $C_{7-12}$ aralkyl or aryloxoalkyl group, wherein the hydrogen atoms thereof may be partially or completely substituted by alkoxy groups; or $R^{101b}$ and $R^{101c}$ may be taken together to form a ring with a proviso that $R^{101b}$ and $R^{101c}$ each represents a $C_{1-6}$ alkylene group; and $K^-$ represents a non-nucleophilic counter ion.

$R^{101a}$, $R^{101b}$, and $R^{101c}$ may be the same or different one another. Specific examples of the alkyl group include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Examples of the alkenyl group include vinyl, allyl, propenyl, butenyl, hexenyl, and cyclohexenyl. Examples of the oxoalkyl group include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Examples of the aryl group include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Examples of the aralkyl group include benzyl, phenylethyl, and phenethyl. Examples of the aryloxoalkyl group include 2-aryl-2-oxoethyl groups such as 2-phenyl-2-oxoethyl, 2-(1-naphthyl)-2-oxoethyl, and 2-(2-naphthyl)-2-oxoethyl. Examples of the non-nucleophilic counter ion represented by $K^-$ include halide ions such as chloride ion and bromide ion, fluoroalkylsulfonate such as triflate, 1,1,1-trifluoroethanesulfonate, and nonafluorobutanesulfonate, arylsulfonates such as tosylate, benzenesulfonate, 4-fluorobenzenesulfonate, and 1, 2, 3, 4, 5-pentafluorobenzenesulfonate, and alkylsulfonates such as mesylate and butanesulfonate.

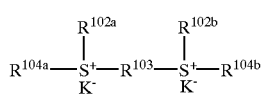

wherein $R^{102a}$ and $R^{102b}$ each represents a linear, branched or cyclic $C_{1-8}$ alkyl group; $R^{103}$ represents a linear, branched or cyclic $C_{1-10}$ alkylene group; $R^{104a}$ and $R^{104b}$ each represents a $C_{3-7}$ 2-oxoalkyl group; and $K^-$ represents a non-nucleophilic counter ion.

Specific examples of $R^{102a}$ and $R^{102b}$ include methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Examples of $R^{103}$ include methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Examples of $R^{104a}$ and $R^{104b}$ include 2-oxopropyl, 2-oxocyclopentyl, 2-oxocyclohexyl, and 2-oxocycloheptyl. Examples of the counter ion represented by $K^-$ are similar to those described in the formula (P1a-1) and (P1a-2).

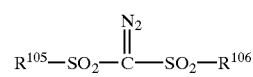

wherein $R^{105}$ and $R^{106}$ each represents a linear, branched or cyclic $C_{1-12}$ alkyl or alkyl hydride group, a $C_{6-20}$ aryl or aryl halide group, or a $C_{7-12}$ aralkyl group.

Examples of the alkyl group as $R^{105}$ or $R^{106}$ include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Examples of the halogenated alkyl group include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl, and alkylphenyl groups such as 2-methylphenyl, 3-methylphenyl, 4-methylphenyl, ethylphenyl, 4-tert-butylphenyl, 4-butylphenyl, and dimethylphenyl. Examples of the halogenated aryl group include fluorophenyl, chlorophenyl, and 1,2,3,4,5-pentafluorophenyl. Examples of the aralkyl group include benzyl and phenethyl.

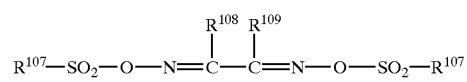

wherein $R^{107}$, $R^{108}$, and $R^{109}$ each represents a linear, branched or cyclic alkyl or halogenated alkyl group having 1 to 12 carbon atoms, an aryl or halogenated aryl group having 6 to 20 carbon atoms, or a $C_{7-12}$ aralkyl group; or $R^{108}$ and $R^{109}$ may be taken together to form a cyclic structure with a proviso that $R^{108}$ and $R^{109}$ each represents a linear or branched $C_{1-6}$ alkylene group.

Examples of the alkyl, halogenated alkyl, aryl, halogenated aryl, and aralkyl groups represented by $R^{107}$, $R^{108}$ and $R^{109}$ are similar to those described as $R^{105}$ and $R^{106}$. Examples of the alkylene group represented by $R^{108}$ and $R^{109}$ include methylene, ethylene, propylene, butylene, and hexylene.

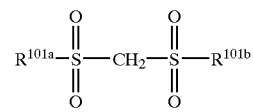

wherein $R^{101a}$ and $R^{101b}$ have the same meanings as defined above.

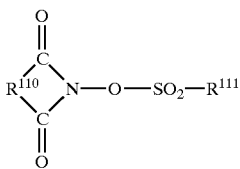

P5 wherein $R^{110}$ represents a $C_{6-10}$ arylene group, a $C_{1-6}$ alkylene group, or a $C_{2-6}$ alkenylene group, wherein the hydrogen atoms thereof may be partially or completely replaced by a linear or branched $C_{1-4}$ alkyl or alkoxy group, a nitro group, an acetyl group, or a phenyl group; $R^{111}$ represents a linear, branched or substituted $C_{1-8}$ alkyl, alkenyl or alkoxyalkyl group, a phenyl group, or a naphthyl group, wherein the hydrogen atoms may be partially or completely replaced by a $C_{1-4}$ alkyl or alkoxy group, a phenyl group which may be substituted by a $C_{1-4}$ alkyl group, an alkoxy group, a nitro group, or an acetyl group, a $C_{3-5}$ hetero-aromatic group, or a chlorine or fluorine atom.

Examples of the arylene group represented by $R^{110}$ include 1,2-phenylene and 1,8-naphthylene; those of the alkylene group include methylene, ethylene, trimethylene, tetramethylene, phenylethylene, and norbornane-2,3-diyl; and those of the alkenylene group include 1,2-vinylene, 1-phenyl-1,2-vinylene, and 5-norbornene-2,3-diyl. Examples of the alkyl group as $R^{111}$ are similar to those described as $R^{101a}$ to $R^{101c}$. Examples of the alkenyl group include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and examples of the alkoxyalkyl group include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Examples of the $C_{1-4}$ alkyl group which may be substituted further include methyl, ethyl, propyl, isopropyl, n-butyl, isobutyl and tert-butyl; examples of the $C_{1-4}$ alkoxy group include methoxy, ethoxy, propoxy, isopropoxy, n-butoxy, isobutoxy, and tert-butoxy; examples of the phenyl group which may be substituted by a $C_{1-4}$ alkyl group, an alkoxy group, a nitro group, or an acetyl group include phenyl, tolyl, p-tert-butoxyphenyl, p-acetylphenyl and p-nitrophenyl; and examples of the $C_{3-5}$ hetero-aromatic group include pyridyl and furyl.

Specific examples of the onium salt include diphenyliodonium trifluoromethanesulfonate, (p-tert-butoxyphenyl) phenyliodonium trifluoromethanesulfonate, diphenyliodonium p-toluenesulfonate, (p-tert-butoxyphenyl) phenyliodonium p-toluenesulfonate, triphenylsulfonium trifluoromethanesulfonate, (p-tert-butoxyphenyl) diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl) diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl) sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate, ethylenebis[methyl(2-oxocyclopentyl)sulfonium trifluoromethanesulfonate], and 1,2'-naphthylcarbonylmethyltetrahydrothiophenium triflate.

The diazomethane derivatives include bis (benzenesulfonyl)diazomethane, bis(p-toluenesulfonyl) diazomethane, bis(xylenesulfonyl)diazomethane, bis (cyclohexylsulfonyl)diazomethane, bis (cyclopentylsulfonyl)diazomethane, bis(n-butylsulfonyl) diazomethane, bis(isobutylsulfonyl)diazomethane, bis(sec-butylsulfonyl)diazomethane, bis(n-propylsulfonyl) diazomethane, bis(isopropylsulfonyl)diazomethane, bis (tert-butylsulfonyl)diazomethane, bis(n-amylsulfonyl) diazomethane, bis(isoamylsulfonyl)diazomethane, bis(sec-amylsulfonyl)diazomethane, bis(tert-amylsulfonyl) diazomethane, 1-cyclohexylsulfonyl-1-(tert-butylsulfonyl) diazomethane, 1-cyclohexylsulfonyl-1-(tert-amylsulfonyl) diazomethane, and 1-tert-amylsulfonyl-1-(tert-butylsulfonyl)diazomethane.

The glyoxime derivatives include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

The bissulfone derivatives include bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane, and bisbenzenesulfonylmethane.

The β-ketosulfone derivatives include 2-cyclohexylcarbonyl-2-(p-toluenesulfonyl)propane and 2-isopropylcarbonyl-2-(p-toluenesulfonyl)propane.

The disulfone derivatives include diphenyl disulfone and dicyclohexyl disulfone.

The nitrobenzyl sulfonate derivatives include 2,6-dinitrobenzyl p-toluenesulfonate and 2,4-dinitrobenzyl p-toluenesulfonate.

The sulfonic acid ester derivatives include 1,2,3-tris (methanesulfonyloxy)benzene, 1,2,3-tris (trifluoromethanesulfonyloxy)benzene, and 1,2,3-tris(p-toluenesulfonyloxy)benzene.

The sulfonic acid esters of an N-hydroxyimide compound include N-hydroxysuccinimide methanesulfonate, N-hydroxysuccinimide trifluoromethanesulfonate, N-hydroxysuccinimide ethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide 1-octanesulfonate, N-hydroxysuccinimide p-toluenesulfonate, N-hydroxysuccinimide p-methoxybenzenesulfonate, N-hydroxysuccinimide 2-chloroethanesulfonate, N-hydroxysuccinimide benzenesulfonate, N-hydroxysuccinimide 2,4,6-trimethylbenzenesulfonate, N-hydroxysuccinimide 1-naphthalenesulfonate, N-hydroxysuccinimide 2-naphthalenesulfonate, N-hydroxy-2-phenylsuccinimide methanesulfonate, N-hydroxymaleimide methanesulfonate, N-hydroxymaleimide ethanesulfonate, N-hydroxy-2-phenylmaleimide methanesulfonate, N-hydroxyglutarimide methanesulfonate, N-hydroxyglutarimide benzenesulfonate, N-hydroxyphthalimide methanesulfonate, N-hydroxyphthalimide benzenesulfonate, N-hydroxyphthalimide trifluoromethanesulfonate, N-hydroxyphthalimide p-toluenesulfonate, N-hydroxynaphthalimide methanesulfonate, N-hydroxynaphthalimide benzenesulfonate, N-hydroxy-5-norbornene-2,3-dicarboxyimide methanesulfonate, N-hydroxy-5-norbornene-2,3-dicarboxyimide trifluoromethanesulfonate, and N-hydroxy-5-norbornene-2,3-dicarboxyimide p-toluenesulfonate.

Of these, preferred are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocylohexyl)sulfonium trifluoromethanesulfonate, and 1,2'-naphthylcarbonylmethyltetrahydrothiophenium triflate; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane; glyoxime derivatives such as bis-O-(p-toluenesulfonyl)-α-dimethylglyoxime and bis-O-(n-butanesulfonyl)-α-dimethylglyoxime; bissulfone derivatives such as bisnaphthylsulfonylmethane; and sulfonic acid esters of an N-hydroxyimide compound such as N-hydroxysuccinimide methanesulfonate, N-hydroxysuccinimide trifluoromethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide p-toluenesulfonate, N-hydroxynaphthalimide methanesulfonate, and N-hydroxynaphthalimide benzenesulfonate.

These acid generators may be used singly or in combination. Onium salts have excellent effects for improving rectangularity, while diazomethane derivatives and glyoxime derivatives have excellent effects for reducing standing waves. Combined use of an onium salt with a diazomethane or a glyoxime derivative enables fine adjustment of the profile.

The acid generator is added in an amount of 0.1 to 15 parts by weight, preferably 0.5 to 8 parts by weight, per 100 parts by weight of the base resin. Amounts less than 0.1 part by weight may deteriorate a sensitivity, while those exceeding 15 parts by weight may lower transparency, thereby deteriorating resolution.

Any organic solvent capable of dissolving therein the base resin, acid generator and another additive can be used in the invention. Examples of such an organic solvent include, but not limited thereto, ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used either singly or in combination. Of the above-described organic solvents, preferred are diethylene glycol dimethyl ether and 1-ethoxy-2-propanol in view of excellence in capacity of dissolving therein the acid generator; propylene glycol monomethyl ether acetate in view of safety; and a mixture thereof.

The organic solvent is preferably added in an amount of 200 to 1,000 parts by weight, especially 400 to 800 parts by weight per 100 parts by weight of the base resin.

The resist material of the invention may comprise a polymer other than the polymer of the invention.

Specific examples of such polymer include, but not limited to, polymers represented by the below-described formula (R1) and/or (R2) and having a weight average molecular weight of 1,000 to about 500,000, preferably 5,000 to 100,000.

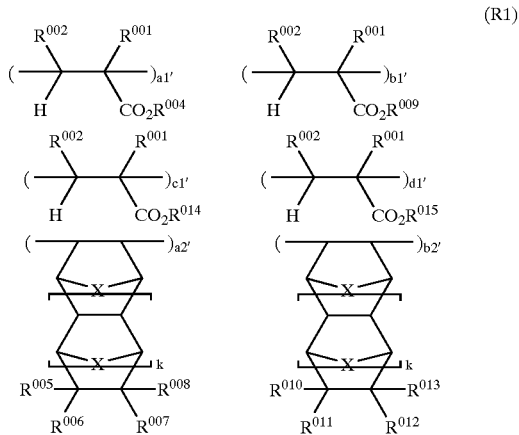

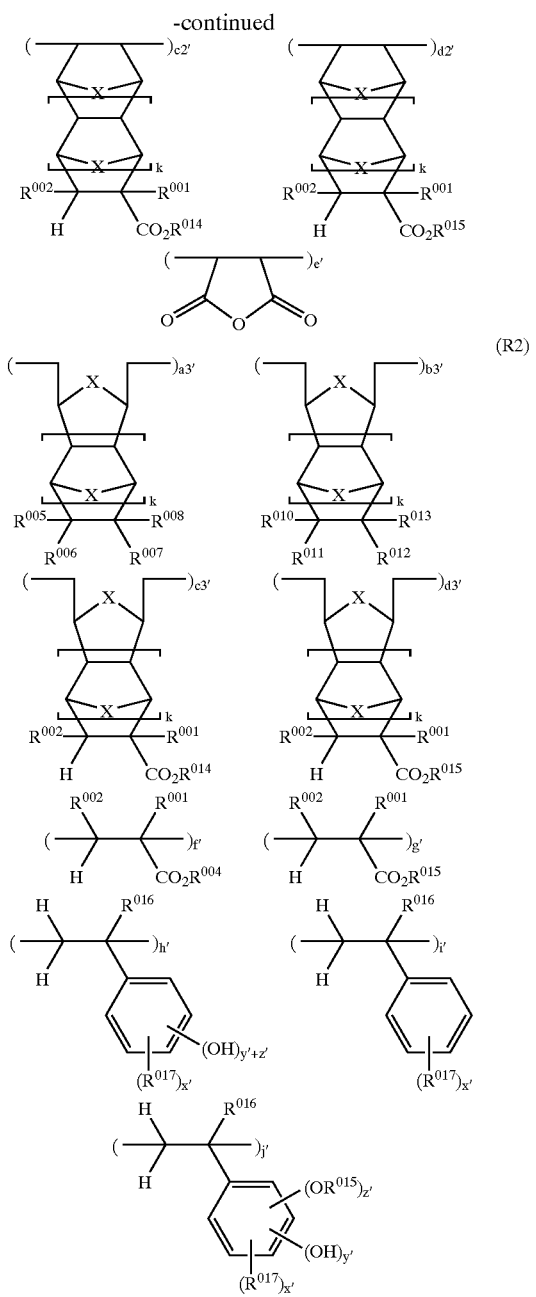

(R2)

wherein, $R^{001}$ represents a hydrogen atom, a methyl group, or $CH_2CO_2R^{003}$; $R^{002}$ represents a hydrogen atom, a methyl group, or a $CO_2R^{003}$; $R^{003}$ represents a linear, branched or cyclic $C_{1-15}$ alkyl group; $R^{004}$ represents a hydrogen atom or a monovalent $C_{1-15}$ hydrocarbon group having a carboxyl or hydroxyl group; at least one of $R^{005}$ to $R^{008}$ represents a monovalent $C_{1-15}$ hydrocarbon group having a carboxyl or hydroxyl group, while the remaining thereof each independently represents a hydrogen or a linear, branched or cyclic $C_{1-15}$ alkyl group; $R^{005}$ to $R^{008}$ may be taken together to form a ring wherein at least one of $R^{005}$ to $R^{008}$ represents a divalent $C_{1-15}$ hydrocarbon group having a carboxyl or hydroxyl group, while the remaining thereof each independently represents a single bond or a linear, branched or cyclic $C_{1-15}$ alkylene group; $R^{009}$ represents a monovalent $C_{2-15}$ hydrocarbon group containing at least one partial structure selected from ether, aldehyde, ketone, ester, carbonate, acid anhydride, amide and imide; at least one of $R^{010}$ to $R^{013}$ represents a monovalent $C_{2-15}$ hydrocarbon group containing at least one partial structure selected from ether, aldehyde, ketone, ester, carbonate, acid anhydride, amide and imide, while the remaining thereof each independently represents a hydrogen atom or a linear, branched or cyclic $C_{1-15}$ alkyl group; $R^{010}$ to $R^{013}$ may be taken together to form a ring wherein at least one of $R^{010}$ to $R^{013}$ represents a divalent $C_{1-15}$ hydrocarbon group containing at least one partial structure selected from ether, aldehyde, ketone, ester, carbonate, acid anhydride, amide and imide, while the remaining thereof each independently represents a single bond or a linear, branched or cyclic $C_{1-15}$ alkylene group; $R^{014}$ represents a polycyclic $C_{7-15}$ hydrocarbon group or a group wherein one or more hydrogen atoms of a $C_{1-4}$ alkyl group are substituted by a polycyclic $C_{7-15}$ hydrocarbon group; $R^{015}$ represents an acid labile group; $R^{016}$ represents a hydrogen atom or a methyl group; $R^{017}$ represents a linear, branched or cyclic $C_{1-8}$ alkyl group; X represents $CH_2$ or an oxygen atom; letter k' stands for 0 or 1; a1', a2', a3', b1', b2', b3', c1', c2', c3', d1', d2', d3' and e' each stands for the number of 0 to less than 1 and satisfies: a1'+a2'+a3'+b1'+b2'+b3'+c1'+c2'+c3'+d1'+d2'+d3'+e'=1; f', g', h', i' and j' are each a number of from 0 to less than 1 and satisfies: f'+g'+h'+i'+j'=1; x', y' and z' each stands for the integer of 0 to 3 and satisfies: $1 \leq x'+y'+z' \leq 5$, and $1 \leq y'+z' \leq 3$.

Specific examples of each of the groups are as described above.

It is preferred that the polymer of the invention and another polymer are blended at a weight ratio ranging from 100:0 to 10:90, especially from 100:0 to 20:80. When the blending ratio of the polymer of the invention is below the above-described range, the resulting resist material may fail to gain a desired performance. The performance of the resist material can be controlled by changing the blending ratio as desired.

The polymer of the invention and another polymer are each not limited to one type. Plural polymers may be used in combination. The use of plural polymers facilitates control of the performance of the resist material.

To the resist material of the invention, a dissolution inhibitor may be added. As a dissolution inhibitor, incorporated in the resist material is a compound obtained by substituting, by an acid labile group, average 0 to 100 mol % of the hydrogen atoms of the phenolic hydroxyl group of a compound having an average molecular weight of 100 to 1,000, preferably 150 to 800 and having at least 2 phenolic hydroxyl groups in the molecule thereof; or a compound obtained by substituting, by an acid labile group, average 50 to 100 mol % of the hydrogen atoms of the carboxyl group of a compound having a carboxyl group in the molecule thereof.

The substitution percentages of the hydrogen atoms of the phenolic hydroxyl group with an acid labile group is on average at least 0 mol %, preferably at least 30 mol %, based on all the phenolic hydroxyl groups. The upper limit is 100 mol %, preferably 80 mol %. The substitution percentage of the hydrogen atoms of the carboxyl groups with an acid labile group is on average at least 50 mol %, preferably at least 70 mol %, based on all the carboxyl groups, with the upper limit being 100 mol %.

Preferred examples of such a compound having at least two phenolic hydroxyl groups or a compound having a carboxyl group include those represented by the following formulas (D1) to (D14):

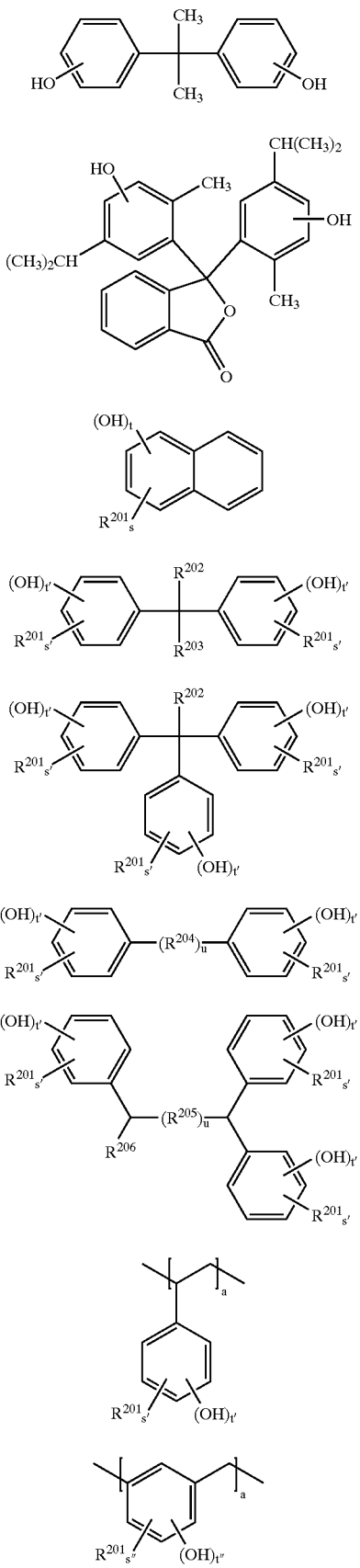

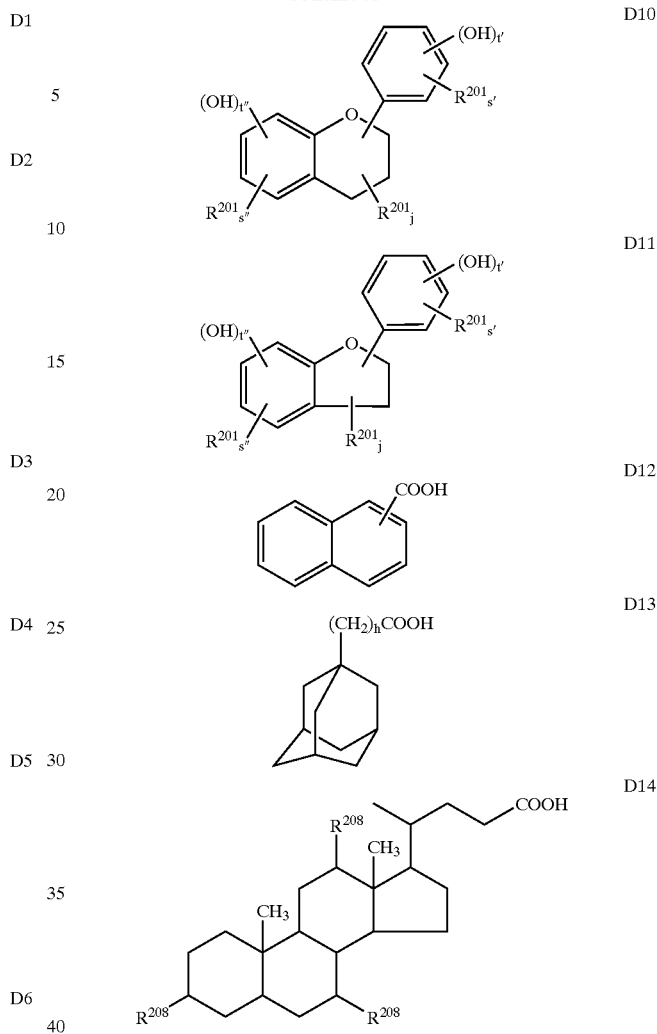

wherein $R^{201}$ and $R^{202}$ each represents a hydrogen atom, or a linear or branched $C_{1-8}$ alkyl or alkenyl group; $R^{203}$ represents a hydrogen atom, a linear or branched $C_{1-8}$ alkyl or alkenyl group, or —$(R^{207})_h$—COOH; $R^{204}$ represents —$(CH_2)_i$— (in which i=2 to 10), a $C_{6-10}$ arylene group, a carbonyl group, a sulfonyl group, an oxygen atom, or a sulfur atom; $R^{205}$ represents a $C_{1-10}$ alkylene group, a $C_{6-10}$ arylene group, a carbonyl group, a sulfonyl group, an oxygen atom, or a sulfur atom; $R^{206}$ represents a hydrogen atom, a linear or branched $C_{1-8}$ alkyl or alkenyl group, or a hydroxyl-substituted phenyl or naphthyl group; $R^{207}$ represents a linear or branched $C_{1-10}$ alkylene group; $R^{208}$ represents a hydrogen atom or a hydroxyl group; the letter j stands for an integer of 0 to 5; u and h each independently stands for 0 or 1; s, t, s', t', s", and t" each stands for a number which satisfies s+t=8, s'+t'=5, and s"+t"=4, and permits each phenyl skeleton to have therein at least one hydroxyl group; and α stands for such a number as to give 100 to 1,000 of molecular weight for each of the compounds of formulas (D8) and (D9).

In the above-described formulas, $R^{201}$ and $R^{202}$ each represents a hydrogen atom, a methyl group, an ethyl group, a butyl group, a propyl group, an ethynyl group or a cyclohexyl group; $R^{203}$ represents a group similar to that described as $R^{201}$ or $R^{202}$, or —COOH or —CH$_2$COOH; $R^{204}$ represents an ethylene group, a phenylene group, a carbonyl group, a sulfonyl group, an oxygen atom or a sulfur atom; $R^{205}$ represents a methylene group or a group similar to that described as $R^{204}$; and $R^{206}$ represents a hydrogen atom, a methyl group, an ethyl group, a butyl group, a propyl group, an ethynyl group, a cyclohexyl group or a phenyl or naphthyl group substituted by a hydroxyl group.

Various groups are usable as the acid labile group of the dissolution inhibitor. Specific examples include groups represented by (L1) to (L4) below, tertiary $C_{4-20}$ alkyl groups, trialkylsilyl groups with each alkyl having 1 to 6 carbon atoms, and $C_{4-20}$ oxoalkyl groups.

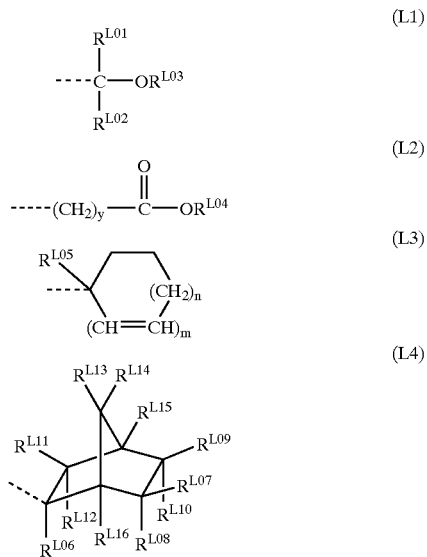

wherein $R^{L01}$ and $R^{L02}$ each represents a hydrogen atom or a linear, branched or cyclic $C_{1-18}$ alkyl group; $R^{L03}$ represents a monovalent $C_{1-18}$ hydrocarbon group which may have a hetero atom such as an oxygen atom; a pair $R^{L01}$ and $R^{L02}$, $R^{L01}$ and $R^{L03}$, or $R^{L02}$ and $R^{L03}$ may be taken together to form a ring, with a proviso that $R^{L01}$, $R^{L02}$ and $R^{L03}$ each represents a linear or branched $C_{1-18}$ alkylene group; $R^{L04}$ represents a tertiary $C_{4-20}$ alkyl group, a trialkylsilyl group with each alkyl having 1 to 6 carbon atoms, a $C_{4-20}$ oxoalkyl group, or a group of formula (L1); $R^{L05}$ represents a monovalent $C_{1-8}$ hydrocarbon group which may contain a hetero atom, or a substituted or unsubstituted $C_{6-20}$ aryl group; $R^{L06}$ represents a monovalent $C_{1-8}$ hydrocarbon group which may have a hetero atom, or a substituted or unsubstituted $C_{6-20}$ aryl group; $R^{L07}$ to $R^{L16}$ each independently represents a hydrogen atom or a monovalent $C_{1-15}$ hydrocarbon group which may contain a hetero atom; $R^{L07}$ to $R^{L16}$ may be taken together to form a ring with a proviso that $R^{L07}$ to $R^{L16}$ each represents a divalent $C_{1-15}$ hydrocarbon group which may contain a hetero atom, or $R^{L07}$ to $R^{L16}$ which are coupled to adjacent carbon atoms may bond together directly to form a double bond; y stands for an integer of 0 to 6; m stands 0 or 1, n stands for any one of 0, 1, 2 and 3, and m and n satisfy 2m+n=2 or 3. Specific examples of each of the groups are similar to the above-described ones.

The dissolution inhibitor is added in an amount of 0 to 50 parts by weight, preferably 0 to 40 parts by weight, more preferably 0 to 30 parts by weight based on 100 parts by weight of the base resin. They may be used singly or as a mixture of two or more of them. Amounts exceeding 50 parts by weight may cause a decrease in the film thickness of patterns, leading to lowering in resolution.

The dissolution inhibitors can be synthesized by introducing an acid labile group into a compound having a phenolic hydroxyl or carboxyl group in accordance with an organic chemical techniques.

The resist material of the invention may comprise a basic compound.

The suitable basic compounds are those capable of suppressing the diffusion rate of an acid which is generated from the acid generator and diffused in the resist film. By incorporating the basic compound, the diffusion rate of the acid in the resist film is suppressed, resulting in an improvement in the resolution, suppression of a change in the sensitivity after exposure, lowering in dependence on a substrate or environment, and improvement of the exposure latitude and the pattern profile.

Examples of basic compound include primary, secondary, and tertiary aliphatic amines, mixed amines, aromatic amines, heterocyclic amines, carboxyl-containing nitrogenous compounds, sulfonyl-containing nitrogenous compounds, hydroxyl-containing nitrogenous compounds, hydroxyphenyl-containing nitrogenous compounds, alcoholic nitrogenous compounds, amide derivatives, and imide derivatives.

More specifically, the primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. The secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. The tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of the mixed amines include dimethylethylamine, methylethylpropylamine, benzylamine, phenethylamine, and benzyldimethylamine. Specific examples of the aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

The carboxyl-containing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine); the sulfonyl-containing nitrogenous compounds include 3-pyridinesulfonic acid and pyridinium p-toluenesulfonate; examples of the hydroxyl-containing nitrogenous compounds, hydroxyphenyl-containing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. The amide derivatives include formamide, N-methylformamide, N,N-dimethylformamide, acetamide, N-methylacetamide, N,N-dimethylacetamide, propionamide, and benzamide. The imide derivatives include phthalimide, succinimide, and maleimide.

It is also possible to incorporate one or more basic compounds selected from those represented by formula (B1) below:

$$N(X)_n(Y)_{3-n} \quad \text{B1}$$

wherein n stands for 1, 2 or 3, Ys each independently represents a hydrogen atom or a linear, branched or cyclic $C_{1-20}$ alkyl group which may contain a hydroxyl group or an ether structure, and Xs each represents any one of the groups represented by formulae (X1) to (X3) below with a proviso that two or three Xs may be coupled together to form a ring.

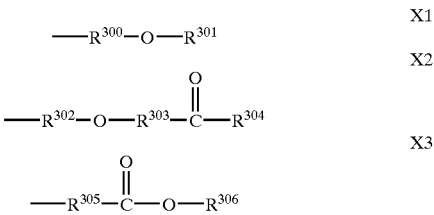

wherein $R^{300}$, $R^{302}$ and $R^{305}$ each represents a linear or branched $C_{1-4}$ alkylene group; $R^{301}$ and $R^{304}$ each represents a hydrogen atom, a linear, branched or cyclic $C_{1-20}$ alkyl group, which may contain at least one hydroxyl group, ether structure, ester structure or lactone ring; and $R^{303}$ represents a single bond or a linear or branched $C_{1-4}$ alkylene group.

Specific examples of the basic compound of the formula (B1) include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl) 2-(methoxycarbonyl)ethylamine, N,N-bis(2-acetoxyethyl) 2-(methoxycarbonyl)ethylamine, N,N-bis(2-hydroxyethyl) 2-(ethoxycarbonyl)ethylamine, N,N-bis(2-acetoxyethyl) 2-(ethoxycarbonyl)ethylamine, N,N-bis(2-hydroxyethyl) 2-(2-methoxyethoxycarbonyl)ethylamine, N,N-bis(2-acetoxyethyl) 2-(2-methoxyethoxycarbonyl)ethylamine, N,N-bis(2-hydroxyethyl) 2-(2-hydroxyethoxycarbonyl)ethylamine, N,N-bis(2-acetoxyethyl) 2-(2-acetoxyethoxycarbonyl)ethylamine, N,N-bis(2-hydroxyethyl) 2-[(methoxycarbonyl)methoxycarbonyl]ethylamine, N,N-bis(2-acetoxyethyl) 2-[(methoxycarbonyl)methoxycarbonyl]ethylamine, N,N-bis(2-hydroxyethyl) 2-(2-oxopropoxycarbonyl)ethylamine, N,N-bis(2-acetoxyethyl) 2-(2-oxopropoxycarbonyl)ethylamine, N,N-bis(2-hydroxyethyl) 2-(tetrahydrofurfuryloxycarbonyl)ethylamine, N,N-bis(2-acetoxyethyl) 2-(tetrahydrofurfuryloxycarbonyl)ethylamine, N,N-bis(2-hydroxyethyl) 2-[(2-oxotetrahydrofuran-3-yl)oxycarbonyl]ethylamine, N,N-bis(2-acetoxyethyl) 2-[(2-oxotetrahydrofuran-3-yl)oxycarbonyl]ethylamine, N,N-bis(2-hydroxyethyl) 2-(4-hydroxybutoxycarbonyl)ethylamine, N,N-bis(2-formyloxyethyl) 2-(4-formyloxybutoxycarbonyl)ethylamine, N,N-bis(2-formyloxyethyl) 2-(2-formyloxyethoxycarbonyl)ethylamine, N,N-bis(2-methoxyethyl) 2-(methoxycarbonyl)ethylamine, N-(2- hydroxyethyl) bis[2-(methoxycarbonyl)ethyl]amine, N-(2-acetoxyethyl) bis[2-(methoxycarbonyl)ethyl]amine, N-(2-hydroxyethyl) bis[2-(ethoxycarbonyl)ethyl]amine, N-(2-acetoxyethyl) bis[2-(ethoxycarbonyl)ethyl]amine, N-(3-hydroxy-1-propyl) bis[2-(methoxycarbonyl)ethyl]amine, N-(3-acetoxy-1-propyl) bis[2-(methoxycarbonyl)ethyl] amine, N-(2-methoxyethyl) bis[2-(methoxycarbonyl)ethyl] amine, N-butylbis[2-(methoxycarbonyl)ethyl]amine, N-butylbis[2-(2-methoxyethoxycarbonyl)ethyl]amine, N-methylbis(2-acetoxyethyl)amine, N-ethylbis(2-acetoxyethyl)amine, N-methylbis(2-pivaloyloxyethyl)amine, N-ethylbis[2-(methoxycarbonyloxy)ethyl]amine, N-ethylbis[2-(tert-butoxycarbonyloxy)ethyl]amine, tris (methoxycarbonylmethyl)amine, tris (ethoxycarbonylmethyl)amine, N-butylbis (methoxycarbonylmethyl)amine, N-hexylbis (methoxycarbonylmethyl) amine, and β-(diethylamino)-δ-valerolactone.

It is also possible to comprise one or more basic compounds selected from cyclic-structure-containing basic compounds represented by the following formula (B2):

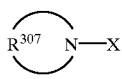

B2 wherein X has the same meaning as described above, and $R^{307}$ represents a linear or branched $C_{2-20}$ alkylene group which may contain one or more carbonyl groups, ether structures, ester structures or sulfide structures.

Specific examples of the cyclic-structure-containing basic compounds represented by the formula (B2) include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino) propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl) propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl) methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, and 2-methoxyethyl morpholinoacetate.

It is also possible to comprise one or more basic compounds selected from cyano-containing basic compounds represented by formulae (B3) to (B6) below.

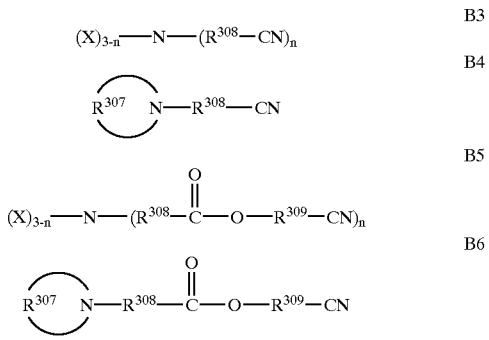

wherein X, $R^{307}$ and n have the same meanings as described above, and $R^{308}$ and $R^{309}$ each independently represents a linear or branched $C_{1-4}$ alkylene group.

Specific examples of the cyano-containing basic compounds represented by the formulas (B3) to (B6) include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis(2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl) aminoacetonitrile, N,N-bis(2-acetoxyethyl) aminoacetonitrile, N,N-bis(2-formyloxyethyl) aminoacetonitrile, N,N-bis(2-methoxyethyl) aminoacetonitrile, N,N-bis[2-(methoxymethoxy)ethyl] aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl] aminoacetonitrile, N-(cyanomethyl)-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis (cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2- acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

The basic compound is added in an amount of 0.001 to 10 parts by weight, preferably 0.01 to 1 part by weight based on 1 part by weight of the acid generator. When the amount is less than 0.001 part by weight, the basic compound sometimes cannot exhibit its effect sufficiently, while amounts exceeding 10 parts by weight may deteriorate resolution or sensitivity.

The resist material of the invention may comprise a compound having a group of formula $\equiv$C—COOH in the molecule thereof.

Examples of the compound having the $\equiv$C—COOH group in the molecule thereof include, but not limited to, one or more compounds selected from Groups I and II below. Addition of this component improves PED stability of the resist, thereby improving edge roughness on the nitride film substrate.

[Group I]

Compounds obtained by partially or completely substituting one or more hydrogen atoms on the phenolic hydroxyl group of the compounds represented by formulae (A-1) to (A-10) below with —$R^{401}$—COOH (wherein $R^{401}$ represents a linear or branched $C_{1-10}$ alkylene group), and in which the molar ratio C/(C+D) is 0.1 to 1.0 wherein "C" represents the phenolic hydroxyl group and "D" represents the $\equiv$C—COOH group in the molecule.

[Group II]

Compounds represented by the below-described formulas (A11) to (A15)

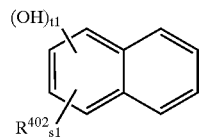

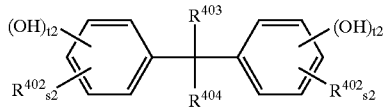

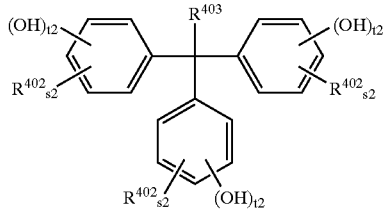

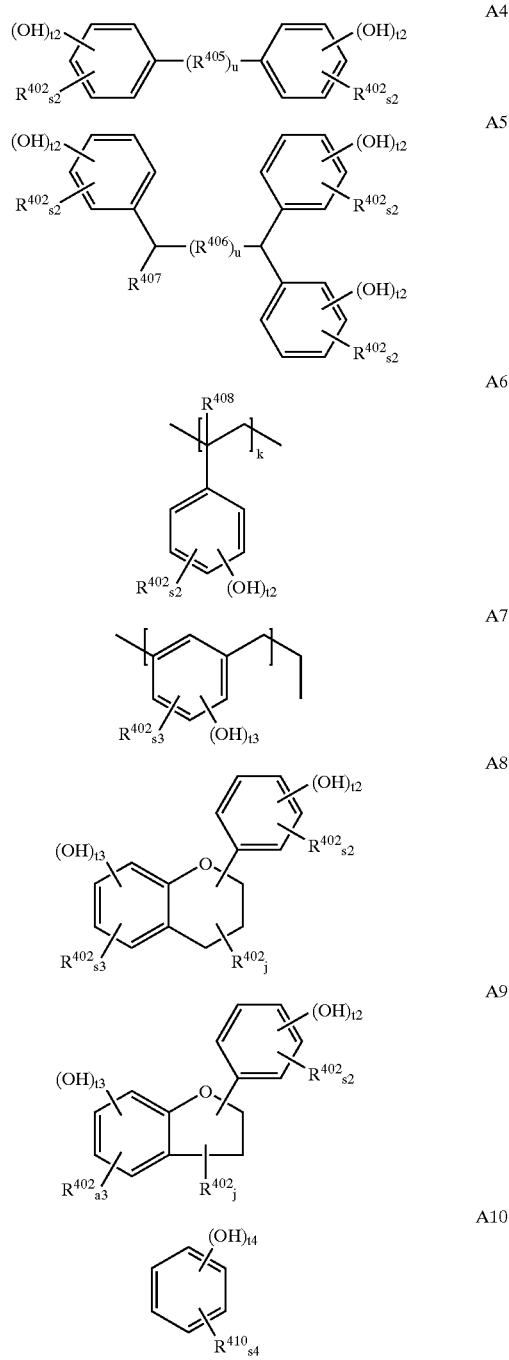

wherein $R^{408}$ represents a hydrogen atom or a methyl group; $R^{402}$ and $R^{403}$ each represents a hydrogen atom or a linear or branched $C_{1-8}$ alkyl or alkenyl group; $R^{404}$ represents a hydrogen atom, a linear or branched $C_{1-8}$ alkyl or alkenyl group, or a group —$(R^{409})_h$—COOR; wherein R' represents a hydrogen atom or —$R^{409}$—COOH; $R^{405}$ represents —$(CH_2)_i$— wherein i is from 2 to 10, a $C_{6-10}$ arylene group, a carbonyl group, a sulfonyl group, an oxygen atom, or a sulfur atom; $R^{406}$ represents a $C_{1-10}$ alkylene group, a $C_{6-10}$ arylene group, a carbonyl group, a sulfonyl group, an oxygen atom, or a sulfur atom; $R^{407}$ represents a hydrogen atom, a linear or branched $C_{1-8}$ alkyl or alkenyl group, or a hydroxyl-substituted phenyl or naphthyl group; $R^{409}$ represents a linear or branched $C_{1-10}$ alkylene group; $R^{410}$ represents a hydrogen atom, a linear or branched $C_{1-8}$ alkyl or alkenyl group, or a group —$R^{411}$—COOH; $R^{411}$ represents a linear or branched $C_{1-10}$ alkylene group; j stands for an integer of 0 to 5; u and h each stands for 0 or 1; s1, t1, s2, t2, s3, t3, s4, and t4 are numbers which satisfy s1+t1=8, s2+t2=5, s3+t3=4, and s4+t4=6, and by which each phenyl skeleton has therein at least one hydroxyl group; κ is a number permitting the compound of formula (A6) to have a weight average molecular weight of 1,000 to 5,000; and λ is a number permitting the compound of formula (A7) to have a weight average molecular weight of 1,000 to 10,000.

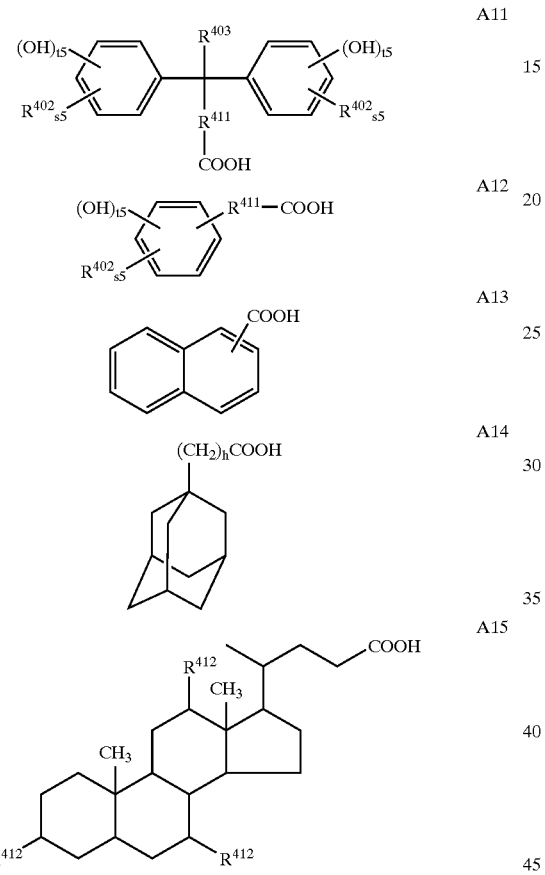

wherein $R^{402}$, $R^{403}$, and $R^{411}$ have the same meanings as described above; $R^{412}$ represents a hydrogen atom or a hydroxyl group; s5 and t5 are numbers which satisfy s5≧0, t5≧0, and s5+t5=5; and h' stands for 0 or 1.

Specific examples of this component include, but not limited to, compounds represented by the following formulas AI-1 to AI-14 and AII-1 to AII-10.

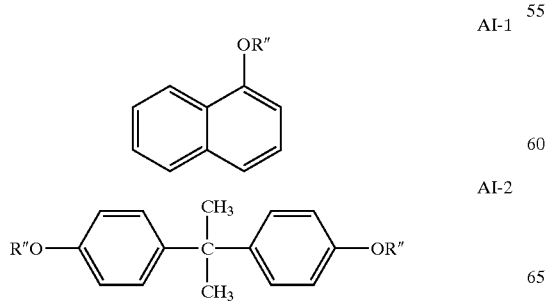

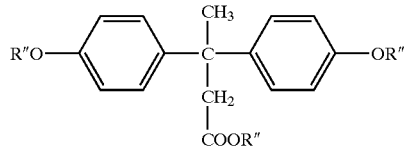

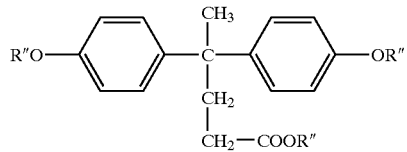

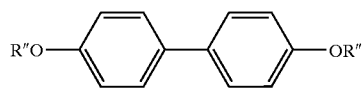

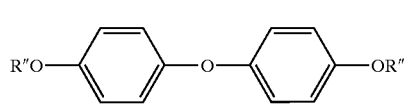

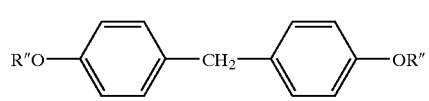

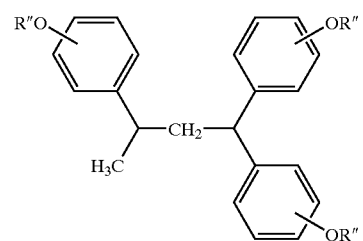

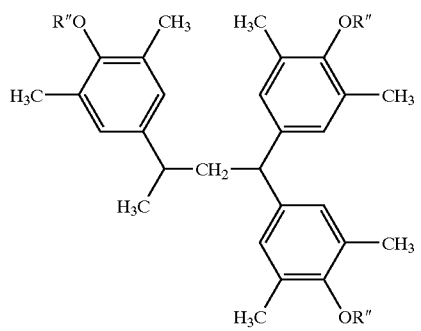

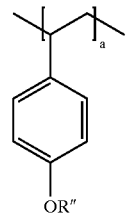

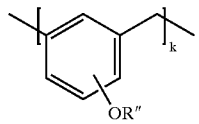

wherein R″ represents a hydrogen atom or a CH₂COOH group with a proviso that in each compound, 10 to 100 mol % of R″ is a CH₂COOH group, α and κ have the same meanings as described above.

The compounds having the ≡C—COOH group in the molecule thereof may be used singly or in combination.

The compound having a ≡C—COOH group in the molecule thereof is added in an amount of 0 to 5 parts by weight, preferably 0.1 to 5 parts by weight, more preferably 0.1 to 3 parts by weight, still more preferably 0.1 to 2 parts by weight based on 100 parts by weight of the base resin. Amounts exceeding 5 parts by weight of the compound may deteriorate the resolution of the resulting resist material.

The resist material of the invention may further contain one or more acetylene alcohol derivatives as an additive for improving storage stability.

As the acetylene alcohol derivatives, those represented by the below-described formulas (S1) and (S2) are Preferred.

$$R^{501}-C\equiv C-\underset{\underset{O-(CH_2CH_2O)_YH}{|}}{\overset{\overset{R^{502}}{|}}{C}}-R^{503} \quad\quad S1$$

$$R^{505}-\underset{\underset{H(OCH_2CH_2)_X-O}{|}}{\overset{\overset{R^{504}}{|}}{C}}-C\equiv C-\underset{\underset{O-(CH_2CH_2O)_YH}{|}}{\overset{\overset{R^{502}}{|}}{C}}-R^{503} \quad\quad S2$$

wherein $R^{501}$, $R^{502}$, $R^{503}$, $R^{504}$, and $R^{505}$ each represents a hydrogen atom or a linear, branched or cyclic $C_{1-8}$ alkyl group; and X and Y each independently stands for 0 or a positive number and satisfies $0\leq X\leq 30$, $0\leq Y\leq 30$, and $0\leq X+Y\leq 40$.

Preferred examples of the acetylene alcohol derivative include Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 (each trade name, product of Air Products and Chemicals Inc.) and Surfynol E1004 (trade name; product of Nisshin Chemical Industry Co., Ltd.).

The acetylene alcohol derivative is added in an amount of 0.01 to 2 wt %, preferably 0.02 to 1 wt %, based on 100 wt % by weight of the resist material. When the amount is less than 0.01 wt %, effects for improving coating characteristics and storage stability may not be exhibited stably. Amounts exceeding 2 wt %, on the other hand, may deteriorate the resolution of the resist material.

In addition, the resist material of the invention may comprise, as an optional component, a surfactant ordinarily employed for improving the coating characteristics. The optional component may be added in a conventional amount within a range not disturbing the exhibition of the advantage of the invention.

Nonionic surfactants are preferred. Examples include perfluoroalkylpolyoxyethylene ethanols, fluorinated alkyl esters, perfluoroalkylamine oxides, perfluoroalkyl EO adducts, and fluorinated organosiloxane compounds. Specific examples include Florade "FC-430" and "FC-431" (each, trade name; product of Sumitomo 3M, Ltd.), Surflon "S-141", "S-145", "KH-10", "KH-20", "KH-30" and "KH-40" (each, trade name; product of Asahi Glass Co., Ltd.), Unidyne "DS-401", "DS-403" and "DS-451" (each, trade name; product of Daikin Industry Co., Ltd.), Megafac "F-8151" (trade name; product of Dai-Nippon Ink & Chemicals, Inc.), and "X-70-092" and "X-70-093" (each, trade name; product of Shin-Etsu Chemical Co., Ltd.). More preferred examples include Florade "FC-430" (product of Sumitomo 3M, Ltd.), "KH-20", and "KH-30" (each, product of Asahi Glass Co., Ltd.) and "X-70-093" (product of Shin-Etsu Chemical Co., Ltd.).

A known lithographic technique can be applied for pattern formation using the resist material of the invention. For example, the resist material is applied onto a substrate such as a silicon wafer by spin coating or like to form thereon a resist film having a thickness of 0.2 to 2.0 $\mu$m, followed by pre-baking on a hot plate at 60 to 150° C. for 1 to 10 minutes, preferably at 80 to 130° C. for 1 to 5 minutes. A mask for forming a desired pattern is then placed over the resist film. The film is exposed to high-energy radiation such as deep-UV ray, an excimer laser or X ray, or electron beam at a dose of about 1 to 200 mJ/cm$^2$, preferably about 5 to 100 mJ/cm$^2$. Subsequently, post exposure baking (PEB) is conducted on a hot plate at 60 to 150° C. for 1 to 5 minutes, preferably at 80 to 130° C. for 1 to 3 minutes. Development is then conducted by using, as a developer, an aqueous alkali solution such as a 0.1 to 5% by wieght, preferably 2 to 3% by weight aqueous solution of tetramethylammonium hydroxide (TMAH), in a conventional manner such as dipping, puddling, or spraying for 0.1 to 3 minutes, preferably 0.5 to 2 minutes, whereby the desired pattern is formed on the substrate. The material of the present invention is suited for miropatterning by using high energy radiation, particularly, far UV rays having a wavelength of 248 to 193 nm, an excimer laser or X ray, or electron beam. Outside the wavelength range, however, the desired pattern may not be obtained.

The present invention will hereinafter be described in detail by Synthesis Examples and Examples. However, it should not be construed that the present invention is limited thereto.

SYNTHESIS EXAMPLES

The polymers of the invention were synthesized in accordance with the following formulation.

Synthesis Example 1

Synthesis of Polymer 1

Mixed were 104.0 g of 2-ethyl-2-norbornyl methacrylate, 118.0 g of 3-hydroxy-1-adamantyl methacrylate, 1.40 g of 2-mercaptoethanol and 555.0 g of tetrahydrofuran. The mixture was heated to 60° C. After addition of 3.28 g of 2,2'-azobisisobutylonitrile, the mixture was stirred for 15 hours at a temperature maintained at 60° C. After cooling to room temperature, the reaction mixture was dissolved in 500 ml of acetone. The resulting solution was added dropwise to 10 L of isopropyl alcohol while vigorous stirring. The solid thus precipitated was collected by filtration and vacuum dried at 40° C. for 15 hours, whereby a polymer as shown by the below-described formula of Polymer 1 was obtained in the form of a white powdery solid. The amount obtained was 193.1 g and the yield was 87.0%. In the formula, Mw means a weight average molecular weight as measured by GPC based on polystyrene standard.

Synthesis Examples 2–12 to 2–12

Synthesis of Polymers 2 to 8

In a similar manner or in a known manner, Polymers 2 to 12 were synthesized.

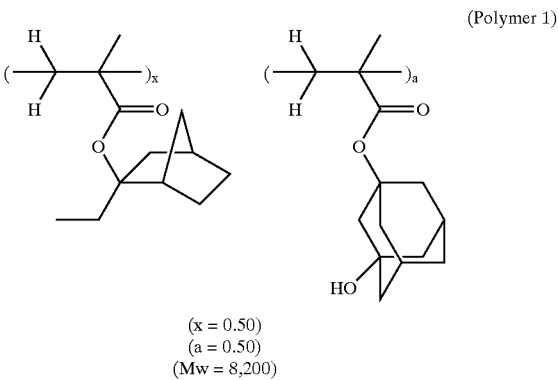

(Polymer 1)
(x = 0.50)
(a = 0.50)
(Mw = 8,200)

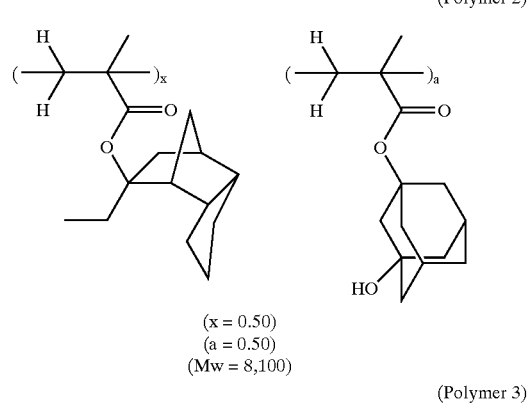

(Polymer 2)
(x = 0.50)
(a = 0.50)
(Mw = 8,100)

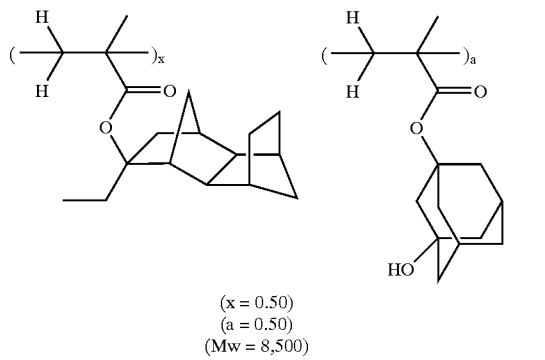

(Polymer 3)
(x = 0.50)
(a = 0.50)
(Mw = 8,500)

-continued
(Polymer 4)
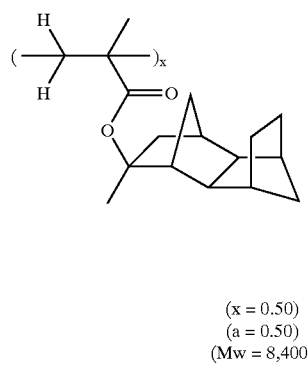
(x = 0.50)
(a = 0.50)
(Mw = 8,400)
(Polymer 5)
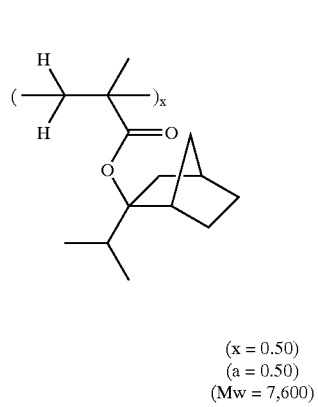
(x = 0.50)
(a = 0.50)
(Mw = 7,600)
(Polymer 6)
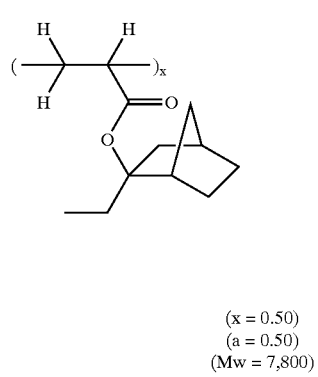
(x = 0.50)
(a = 0.50)
(Mw = 7,800)
(Polymer 7)
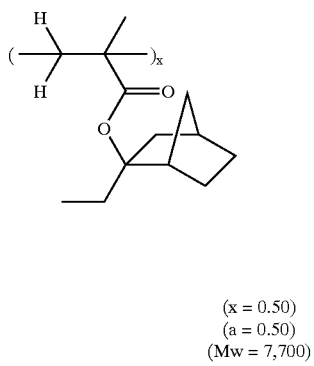
(x = 0.50)
(a = 0.50)
(Mw = 7,700)
-continued
(Polymer 8)
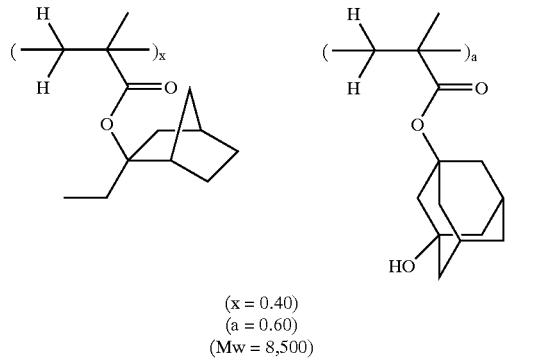
(x = 0.40)
(a = 0.60)
(Mw = 8,500)
(Polymer 9)
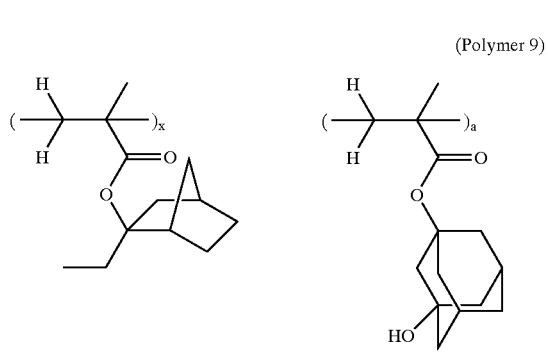
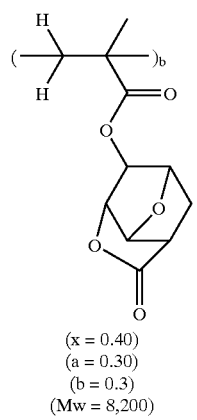
(x = 0.40)
(a = 0.30)
(b = 0.3)
(Mw = 8,200)
(Polymer 10)
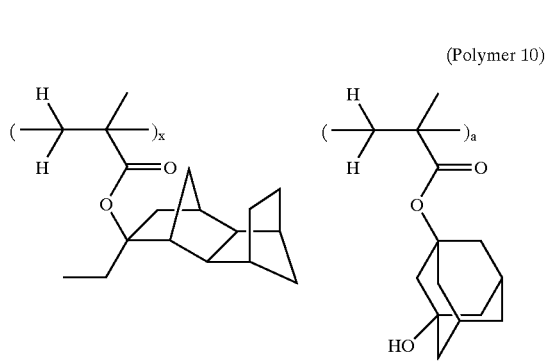

-continued

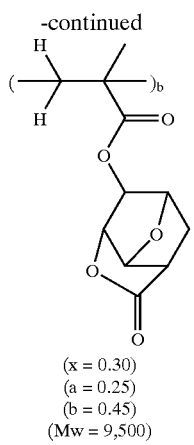

(x = 0.30)
(a = 0.25)
(b = 0.45)
(Mw = 9,500)

(Polymer 11)

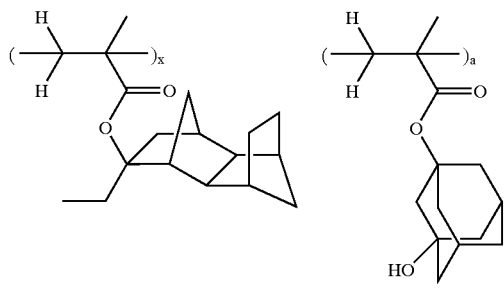

(x = 0.30)
(a = 0.35)
(b = 0.35)
(Mw = 8,500)

(Polymer 12)

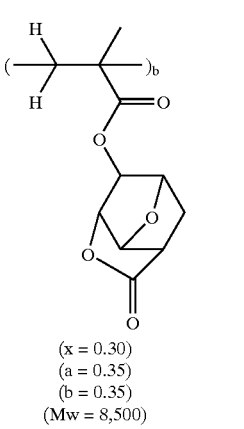

-continued

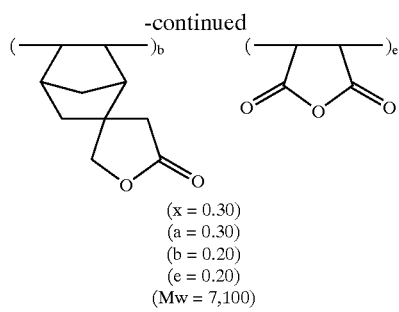

(x = 0.30)
(a = 0.30)
(b = 0.20)
(e = 0.20)
(Mw = 7,100)

EXAMPLES

Resolution for the resist material comprising the polymer of the invention as a base resin was evaluated.

Examples 1 to 23 and Comparative Examples 1 to 6

A base resin selected from the polymers (Polymers 1 to 12) of the above formulae and polymers (Polymers 13 to 16) of the below formulae for comparison, an acid generator, a basic compound and a solvent were mixed in accordance with the composition as shown in Tables 1 and 2. The resulting mixture was filtered through a Teflon filter (pore size: 0.2 μm), and obtained as a resist material.

(Polymer 13)

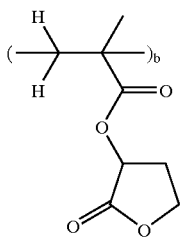 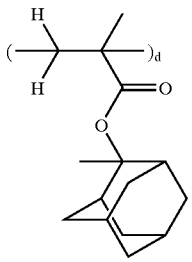

(b = 0.50)
(d = 0.50)
(Mw = 8,100)

(Polymer 14)

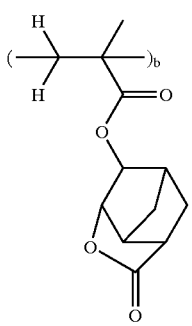 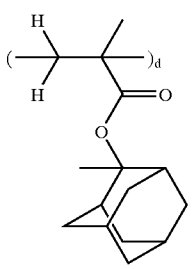

(b = 0.50)
(d = 0.50)
(Mw = 8,500)

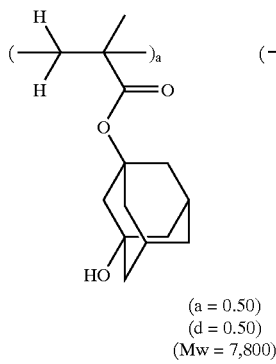

(Polymer 15)

(a = 0.50)
(d = 0.50)
(Mw = 7,800)

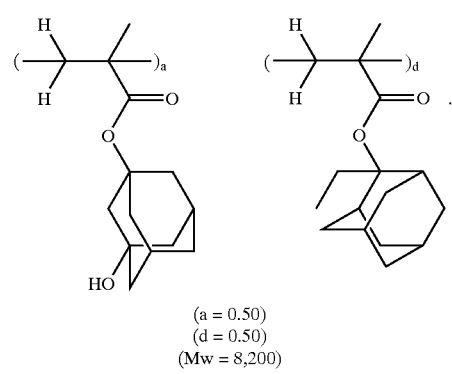

(Polymer 16)

(a = 0.50)
(d = 0.50)
(Mw = 8,200)

Each of the resist solutions was spin-coated onto a silicon wafer to which an antireflective film ("ARC25", trade name; product of Nissan Chemical, 77 nm) had been applied, followed by heat treatment at 130° C. for 60 seconds, whereby a resist film having a thickness of 375 nm was formed. After exposure of the resulting resist film by using an ArF excimer laser stepper (product of Nikon Corporation; NA=0.55) and heat treatment at 110 to 130° C. for 60 seconds, puddle development was conducted using a 2.38 wt % aqueous tetramethylammonium hydroxide solution for 60 seconds to form 1:1 line-and-space patterns. The wafer after development was cut and the cross-section thereof was observed with SEM (scanning electron microscope). The minimum line width ($\mu$m) of the line-and-space separated at an exposure amount (the optimum exposure amount=Eop, mJ/cm$^2$) at which the line-and-space of 0.20 $\mu$m is resolved at 1:1, is designated as the resolution of the resist. The pattern shape observed at that time was classified by "good" and "bad".

Composition and evaluation results of each resist material obtained in Examples are shown in Table 1, while those of each resist material obtained in Comparative Examples are shown in Table 2. In Tables 1 and 2, the acid generator, the basic compound and solvent employed are indicated as the corresponding abbreviations. In any of these resist materials, the solvent contained 0.01 wt % of "KH-20" (product of Asahi Glass Ltd.).

TPSTf: triphenylsulfonium trifluoromethanesulfonate

TPSNf: triphenylsulfonium nonafluorobutanesulfonate

TEA: triethanolamine

TMMEA: trismethoxymethoxyethylamine

TMEMEA: trismethoxyethoxymethoxyethylamine

PGMEA: propylene glycol methyl ether acetate

CyHO: cyclohexanone

TABLE 1

| Example | Polymer (parts by weight) | Acid generator (parts by weight) | Basic compound (parts by weight) | Solvent (parts by weight) | PEB temp. (° C.) | Optimum exposure amount (mJ/cm$^2$) | Resolution ($\mu$m) | Shape |
|---|---|---|---|---|---|---|---|---|
| 1 | Polymer 1 (80) | TPSNf (1.090) | TEA (0.125) | CyHO (560) | 110 | 20.0 | 0.16 | good (rectangular) |
| 2 | Polymer 2 (80) | TPSNf (1.090) | TEA (0.125) | CyHO (560) | 110 | 19.0 | 0.16 | good (rectangular) |
| 3 | Polymer 3 (80) | TPSNf (1.090) | TEA (0.125) | CyHO (560) | 110 | 18.0 | 0.16 | good (rectangular) |
| 4 | Polymer 4 (80) | TPSNf (1.090) | TEA (0.125) | CyHO (560) | 120 | 19.0 | 0.16 | good (rectangular) |
| 5 | Polymer 5 (80) | TPSNf (1.090) | TEA (0.125) | CyHO (560) | 110 | 17.0 | 0.16 | good (rectangular) |
| 6 | Polymer 6 (80) | TPSNf (1.090) | TEA (0.125) | CyHO (560) | 110 | 18.0 | 0.16 | good (rectangular) |
| 7 | Polymer 7 (80) | TPSNf (1.090) | TEA (0.125) | CyHO (560) | 110 | 21.0 | 0.16 | good (rectangular) |
| 8 | Polymer 8 (80) | TPSNf (1.090) | TEA (0.125) | CyHO (560) | 110 | 22.0 | 0.16 | good (rectangular) |
| 9 | Polymer 9 (80) | TPSTf (1.090) | TEA (0.125) | PGMEA (480) | 110 | 21.0 | 0.15 | good (rectangular) |
| 10 | Polymer 10 (80) | TPSTf (1.090) | TEA (0.125) | PGMEA (480) | 110 | 21.0 | 0.15 | good (rectangular) |
| 11 | Polymer 11 (80) | TPSTf (1.090) | TEA (0.125) | PGMEA (480) | 110 | 22.0 | 0.15 | good (rectangular) |
| 12 | Polymer 12 (80) | TPSNf (1.090) | TEA (0.125) | CyHO (560) | 110 | 26.0 | 0.17 | good (rectangular) |
| 13 | Polymer 1 (80) | TPSTf (0.080) | TEA (0.125) | CyHO (560) | 110 | 18.0 | 0.16 | good (rectangular) |
| 14 | Polymer 1 (80) | TPSTf (0.080) | TMMEA (0.236) | CyHO (560) | 110 | 19.0 | 0.16 | good (rectangular) |

TABLE 1-continued

| Example | Polymer (parts by weight) | Acid generator (parts by weight) | Basic compound (parts by weight) | Solvent (parts by weight) | PEB temp. (° C.) | Optimum exposure amount (mJ/cm$^2$) | Resolution ($\mu$m) | Shape |
|---|---|---|---|---|---|---|---|---|
| 15 | Polymer 1 (80) | TPSTf (0.080) | TMEMEA (0.347) | CyHO (560) | 110 | 19.0 | 0.17 | good (rectangular) |
| 16 | Polymer 1 (80) | TPSNf (1.090) | TMMEA (0.236) | CyHO (560) | 110 | 21.0 | 0.15 | good (rectangular) |
| 17 | Polymer 8 (80) | TPSNf (1.090) | TMMEA (0.236) | CyHO (560) | 110 | 23.0 | 0.15 | good (rectangular) |
| 18 | Polymer 9 (80) | TPSNf (1.090) | TMMEA (0.236) | PGMEA (480) | 110 | 23.0 | 0.15 | good (rectangular) |
| 19 | Polymer 9 (80) | TPSNf (1.090) | TMMEA (0.236) | PGMEA (480) | 105 | 23.0 | 0.15 | good (rectangular) |
| 20 | Polymer 9 (80) | TPSNf (1.090) | TMMEA (0.236) | PGMEA (480) | 115 | 23.0 | 0.15 | good (rectangular) |
| 21 | Polymer 9 (80) | TPSNf (2.180) | TEA (0.250) | PGMEA (480) | 115 | 20.0 | 0.14 | good (rectangular) |
| 22 | Polymer 10 (80) | TPSNf (2.180) | TEA (0.250) | PGMEA (480) | 115 | 21.0 | 0.14 | good (rectangular) |
| 23 | Polymer 11 (80) | TPSNf (2.180) | TEA (0.250) | PGMEA (480) | 115 | 22.0 | 0.14 | good (rectangular) |

TABLE 2

| Comp. Example | Polymer s (parts by weight) | Acid generator (parts by weiht) | Basic compound (parts by weight) | Solvent (parts by weight) | PEB temp. (° C.) | Optimum exposure amount (mJ/cm$^2$) | Resolution ($\mu$m) | Shape |
|---|---|---|---|---|---|---|---|---|
| 1 | Polymer 13 (80) | TPSNf (1.090) | TMMEA (0.236) | PGMEA (480) | 130 | 28.0 | 0.17 | bad *1 |
| 2 | Polymer 14 (80) | TPSNf (1.090) | TMMEA (0.236) | CyHO (560) | 130 | 32.0 | 0.17 | bad *1 |
| 3 | Polymer 15 (80) | TPSNf (1.090) | TMMEA (0.236) | CyHO (560) | 120 | 31.0 | 0.17 | bad *1 |
| 4 | Polymer 16 (80) | TPSNf (1.090) | TMMEA (0.236) | CyHO (560) | 130 | 35.0 | 0.17 | bad *1 |
| 5 | Polymer 16 (80) | TPSNf (1.090) | TMMEA (0.236) | CyHO (560) | 125 | 38.0 | 0.19 | bad *1, *2 |
| 6 | Polymer 16 (80) | TPSNf (1.090) | TMMEA (0.236) | CyHO (560) | 135 | 34.0 | 0.17 | bad *1 |

*1 contanimation on substrate
*2 T-top shape

It has been confirmed from the results of Tables 1 and 2 that the resist materials of the invention exhibit high sensitivity and high resolution and are excellent from the viewpoint of temperature dependence upon heat treatment.

What is claimed is:

1. A polymer having a weight-average molecular weight of 1,000 to 500,000, comprising A) repeating unit represented by formula (2) below, a repeating unit represented by formula (3) below, or two or more repeating units selected from the group consisting of repeating units represented by formulae (1), (2), and (3) below; and B) one or more repeating units represented by formula (4) below:

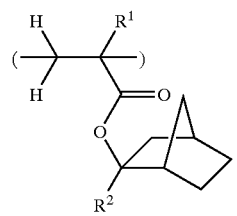

(1)

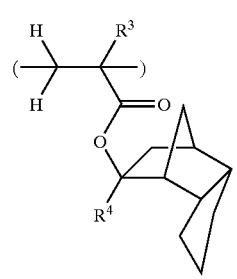

(2)

-continued (3)

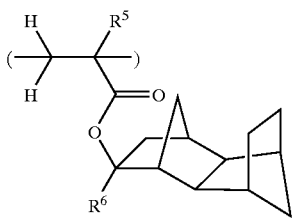

(4)

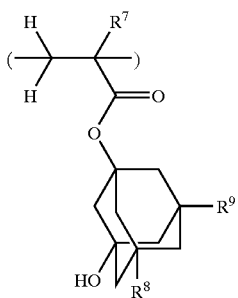

wherein, $R^1$, $R^3$, $R^5$ and $R^7$ each represents a hydrogen atom or a methyl group, $R^2$, $R^4$ and $R^6$ each represents a linear, branched or cyclic $C_{1-8}$ alkyl group, and $R^8$ and $R^9$ each represents a hydrogen atom or a hydroxyl group, with a proviso that $R^2$, $R^4$ and $R^6$ are bonded in endo-sites of a bicyclo[2.2.1]heptane ring, a tricyclo[5.2.1.0$^{2,6}$]decane ring and a tetracyclo[4.4.0.1$^{2,5}$.1$^{7,10}$]dodecane ring, respectively.

2. A polymer according to claim 1, further comprising one or more repeating units selected from those represented by formula (M1) to (M9) below:

(M1)

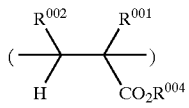

(M2)

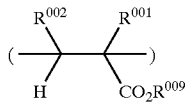

(M3)

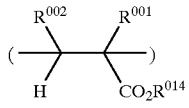

(M4)

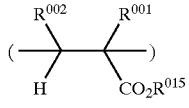

(M5)

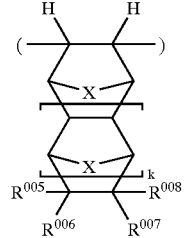

(M6)

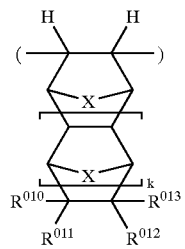

(M7)

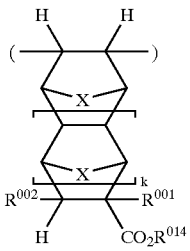

(M8)

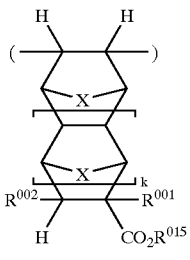

(M9)

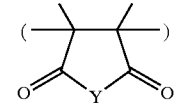

wherein $R^{001}$ represents a hydrogen atom, a methyl group, or $CH_2CO_2R^{003}$; $R^{002}$ represents a hydrogen atom, a methyl group, or $CO_2R^{003}$; $R^{003}$ represents a linear, branched or cyclic $C_{1-15}$ alkyl group; $R^{004}$ represents a hydrogen atom or a monovalent $C_{1-15}$ hydrocarbon group having a carboxyl or hydroxyl group while the remaining groups thereof each independently represents a hydrogen atom or a linear, branched or cyclic $C_{1-15}$ alkyl group; $R^{005}$ to $R^{008}$ may be taken together to form a ring wherein at least one of $R^{005}$ to $R^{008}$ represents a divalent $C_{1-15}$ hydrocarbon group having a carboxyl or hydroxyl group, while the remaining groups thereof each independently represents a single bond or a linear, branched or cyclic $C_{1-15}$ alkylene group; $R^{009}$ represents a monovalent $C_{2-15}$ hydrocarbon group having at least one partial structure selected from ether, aldehyde, ketone, ester, carbonate, acid anhydride, amide and imide; at least one of $R^{010}$ to $R^{013}$ represents a monovalent $C_{2-15}$ hydrocarbon group having at least one partial structure selected from either, aldehyde, ketone, ester, carbonate, acid anhydride, amide and imide, while the remaining groups thereof each independently represents a hydrogen atom or a linear, branched or cyclic $C_{1-15}$ alkyl group; $R^{010}$ to $R^{013}$ may be taken together to form a ring wherein at least one of $R^{010}$ to $R^{013}$ represents a divalent $C_{1-15}$ hydrocarbon group having at least one partial structure selected from ether, aldehyde, ketone, ester, carbonate, acid anhydride, amide and imide, while the remaining groups thereof each independently represents a single bond or a linear, branched or cyclic $C_{1-15}$ alkylene group; $R^{014}$ represents a polycyclic $C_{7-15}$ hydrocarbon group or a group wherein one or more hydrogen atoms of $C_{1-4}$ alkyl group are substituted by a polycyclic $C_{7-15}$ hydrocarbon group; $R^{015}$ represents an acid labile group, X represents $CH_2$ or an oxygen atom, Y represents —O— or —($NR^{016}$)—; $R^{016}$ represents a hydrogen atom or a linear, branched or cyclic $C_{1-15}$ alkyl group, and k stands for 0 or 1.

3. A polymer according to claim 1, further comprising one or more repeating units derived from one or more monomers selected from the group consisting of substituted acrylates such as methyl methacrylate, methyl crotonate, dimethyl maleate, and dimethyl itaconate, unsaturated carboxylic acids such as maleic acid, fumaric acid and itaconic acid, norbornene, substituted norbornenes such as methyl norbornene-5-carboxylate, and unsaturated acid anhydrides such as itaconic anhydride.

4. A resist material comprising said polymer of claim 1 as a base resin.

5. A patterning method comprising steps of applying said resist material of claim 4 to a substrate; after heat treatment, exposing the substrate to high energy beams or electron beams through a photomask; and after heat treatment, developing with a developer.

6. A polymer having a weight-average molecular weight of 1,000 to 500,000, consisting essentially of one or more repeating units represented by formulae (1) and/or (2) below; and one or more repeating units represented by formula (4) below:

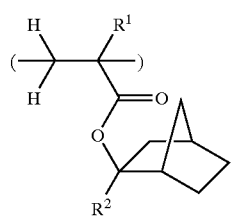

(1)

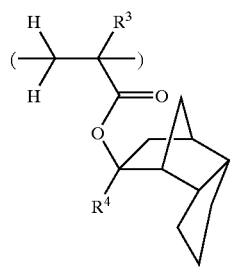

(2)

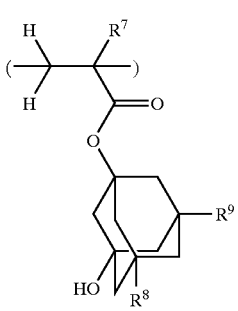

(4)

wherein, $R^1$, $R^3$, and $R^7$ each represents a hydrogen atom or a methyl group, $R^2$ and $R^4$ each represents a linear, branched or cyclic $C_{1-8}$ alkyl group, and $R^8$ and $R^9$ each represents a hydrogen atom or a hydroxyl group, with a proviso that $R^2$, $R^4$ are bonded in endo-sites of a bicyclo[2.2.1]heptane ring, a tricyclo[5.2.1.0$^{2,6}$]decane ring and a tetracyclo[4.4.0.1$^{2,5}$.1$^{7,10}$]dodecane ring, respectively.

7. A polymer according to claim 6, consisting essentially of one or more repeating units represented by formulae (1); and one or more repeating units represented by formula (4); wherein the repeating units are selected from Polymers 1, 5, 6, 7 and 8 below:

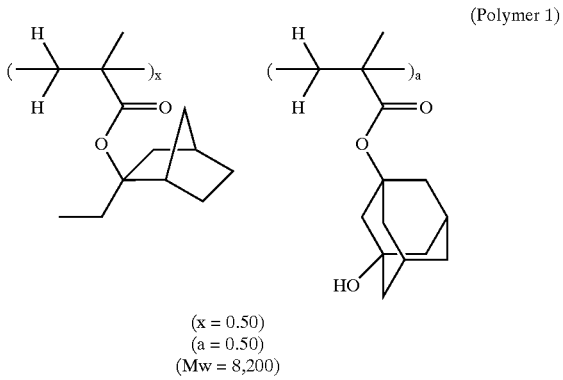

(Polymer 1)

(x = 0.50)
(a = 0.50)
(Mw = 8,200)

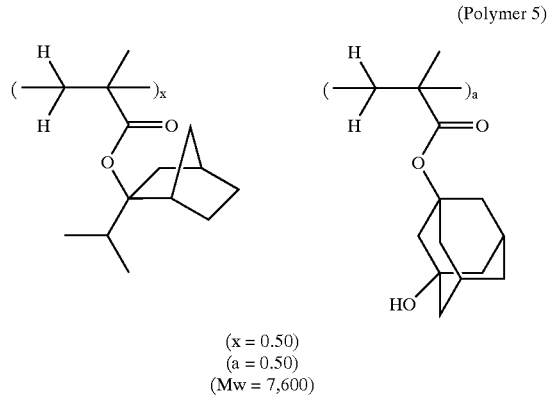

(Polymer 5)

(x = 0.50)
(a = 0.50)
(Mw = 7,600)

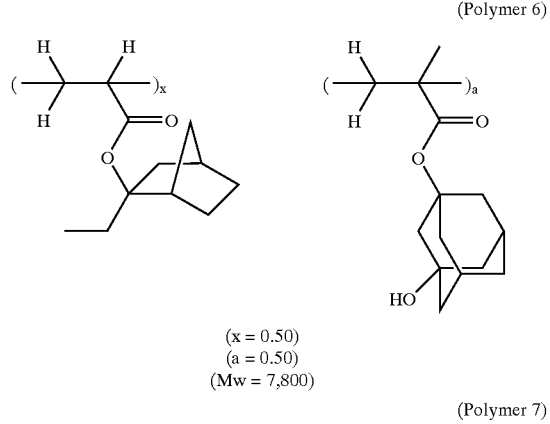

(Polymer 6)

(x = 0.50)
(a = 0.50)
(Mw = 7,800)

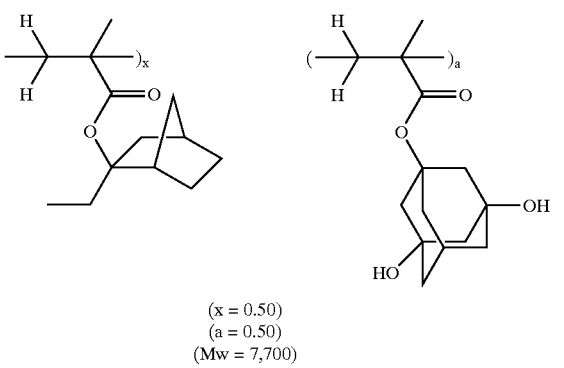

(Polymer 7)

(x = 0.50)
(a = 0.50)
(Mw = 7,700)

(Polymer 8)

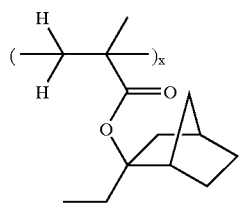
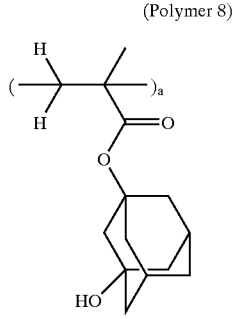

(x = 0.40)
(a = 0.60)
(Mw = 8,500).

8. A resist material comprising said polymer of claim 6 as a base resin.

9. A patterning method comprising steps of applying said resist material of claim 8 to a substrate; after heat treatment, exposing the substrate to high energy beams or electron beams through a photomask; and after heat treatment, developing with a developer.

10. A polymer having a weight-average molecular weight of 1,000 to 500,000, consisting essentially of one or more repeating units represented by formulae (1) and/or (2) below; one or more repeating units represented by formula (4) below: and one or more repeating units selected from those represented by formula (M1) to (M9) below:

(1)
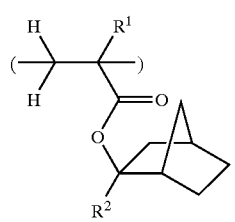

(2)
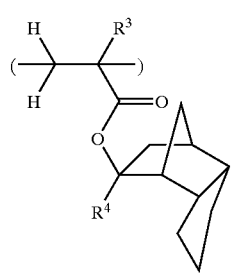

(4)
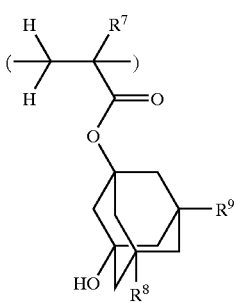

(M1)
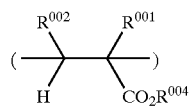

(M2)
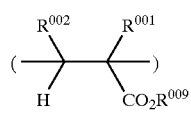

(M3)
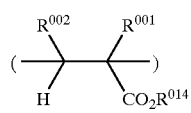

(M4)
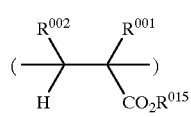

(M5)
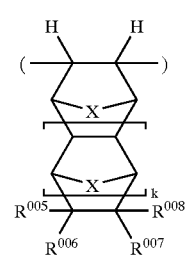

(M6)
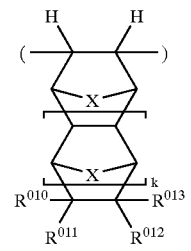

(M7)
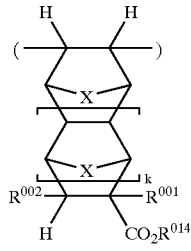

(M8)
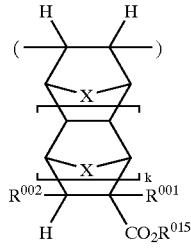

-continued

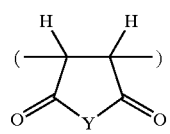
(M9)

wherein, $R^1$, $R^3$ and $R^7$ each represents a hydrogen atom or a methyl group, $R^2$ and $R^4$ each represents a linear, branched or cyclic $C_{1-8}$ alkyl group, and $R^8$ and $R^9$ each represents a hydrogen atom or a hydroxyl group, with a proviso that $R^2$ and $R^4$ are bonded in endo-sites of a bicyclo[2.2.1]heptane ring, a tricyclo[5.2.1.0$^{2,6}$]decane ring and a tetracyclo [4.4.0.1$^{2,5}$.1$^{7,10}$]dodecane ring, respectively; $R^{001}$ represents a hydrogen atom, a methyl group, or $CH_2CO_2R^{003}$; $R^{002}$ represents a hydrogen atom, a methyl group, or $CO_2R^{003}$; $R^{003}$ represents a linear, branched or cyclic $C_{1-15}$ alkyl group; $R^{004}$ represents a hydrogen atom or a monovalent $C_{1-15}$ hydrocarbon group having a carboxyl or hydroxyl group; at least one of $R^{005}$ to $R^{008}$ represents a monovalent $C_{1-15}$ hydrocarbon group having a carboxyl or hydroxyl group while the remaining groups thereof each independently represents a hydrogen atom or a linear, branched or cyclic $C_{1-15}$ alkyl group; $R^{005}$ to $R^{008}$ may be taken together to form a ring wherein at least one of $R^{005}$ to $R^{008}$ represents a divalent $C_{1-15}$ hydrocarbon group having a carboxyl or hydroxyl group, while the remaining groups thereof each independently represents a single bond or a linear, branched or cyclic $C_{1-15}$ alkylene group; $R^{009}$ represents a monovalent $C_{2-15}$ hydrocarbon group having at least one partial structure selected from ether, aldehyde, ketone, ester, carbonate, acid anhydride, amide and imide; at least one of $R^{010}$ to $R^{013}$ represents a monovalent $C_{2-15}$ hydrocarbon group having at least one partial structure selected from ether, aldehyde, ketone, ester, carbonate, acid anhydride, amide and imide, while the remaining groups thereof each independently represents a hydrogen atom or a linear, branched or cyclic $C_{1-15}$ alkyl group; $R^{010}$ to $R^{013}$ may be taken together to form a ring wherein at least one of $R^{010}$ to $R^{013}$ represents a divalent $C_{1-15}$ hydrocarbon group having at least one partial structure selected from ether, aldehyde, ketone, ester, carbonate, acid anhydride, amide and imide, while the remaining groups thereof each independently represents a single bond or a linear, branched or cyclic $C_{1-15}$ alkylene group; $R^{014}$ represents a polycyclic $C_{7-15}$ hydrocarbon group or a group wherein one or more hydrogen atoms of $C_{1-4}$ alkyl group are substituted by a polycyclic $C_{7-15}$ hydrocarbon group; $R^{015}$ represents an acid labile group, X represents $CH_2$ or an oxygen atom, Y represents —O— or —(NR$^{016}$)—; $R^{016}$ represents a hydrogen atom or a linear, branched or cyclic $C_{1-15}$ alkyl group, and k stands for 0 or 1.

11. A polymer having a weight-average molecular weight of 1,000 to 500,000, consisting essentially of one or more repeating units represented by formulae (1) and/or (2) below; one or more repeating units represented by formula (4) below; and one or more repeating units derived from one or more monomers selected from the group consisting of substituted acrylates such as methyl methacrylate, methyl crotonate, dimethyl maleate, and dimethyl itaconate, unsaturated carboxylic acids such as maleic acid, fumaric acid and itaconic acid, norbornene, substituted norbornenes such as methyl norbornene-5-carboxylate, and unsaturated acid anhydrides such as itaconic anhydride:

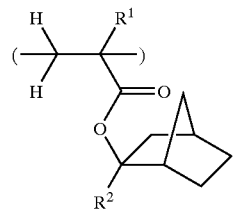
(1)

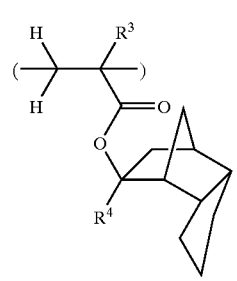
(2)

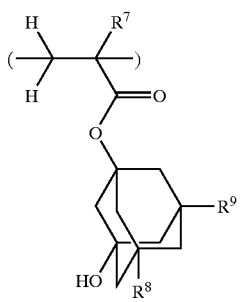
(4)

wherein, $R^1$, $R^3$ and $R^7$ each represents a hydrogen atom or a methyl group, $R^2$ and $R^4$ each represents a linear, branched or cyclic $C_{1-8}$ alkyl group, and $R^8$ and $R^9$ each represents a hydrogen atom or a hydroxyl group, with a proviso that $R^2$ and $R^4$ are bonded in endo-sites of a bicyclo[2.2.1]heptane ring, a tricyclo[5.2.1.0$^{2,6}$]decane ring and a tetracyclo [4.4.0.1$^{2,5}$.1$^{7,10}$]dodecane ring, respectively.

12. A polymer having a weight-average molecular weight of 1,000 to 500,000, comprising one or more repeating units selected from the group consisting of repeating units represented by formulae (1) to (3) below; one or more repeating units represented by formula (4) below; and one or more repeating units selected from the group consisting of repeating units (M2-1), (M2-2), (M2-3) and (M2-4):

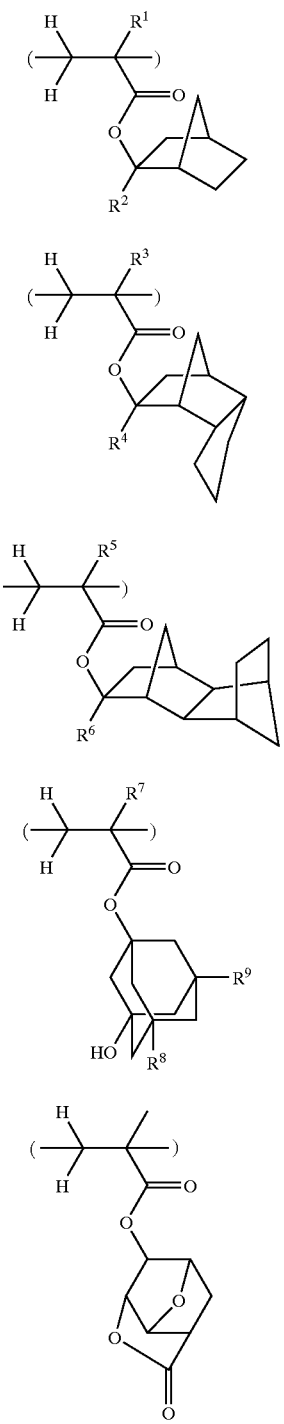

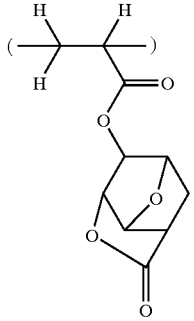

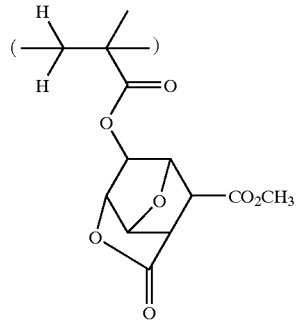

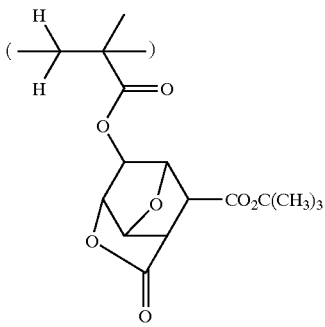

wherein, $R^1$, $R^3$, $R^5$ and $R^7$ each represents a hydrogen atom or a methyl group, $R^2$, $R^4$ and $R^6$ each represents a linear, branched or cyclic $C_{1-8}$ alkyl group, and $R^8$ and $R^9$ each represents a hydrogen atom or a hydroxyl group, with a proviso that $R^2$, $R^4$ and $R^6$ are bonded in endo-sites of a bicyclo[2.2.1]heptane ring, a tricyclo[5.2.1.0$^{2,6}$]decane ring and a tetracyclo[4.4.0.1$^{2,5}$.1$^{7,10}$]dodecane ring, respectively.

13. A resist material comprising said polymer of claim 12 as a base resin.

14. A patterning method comprising steps of applying said resist material of claim 13 to a substrate; after heat treatment, exposing the substrate to high energy beams or electron beams through a photomask; and after heat treatment, developing with a developer.

* * * * *